United States Patent [19]
Koyama et al.

[11] Patent Number: 5,991,913
[45] Date of Patent: Nov. 23, 1999

[54] ERROR CORRECTING DEVICE

[75] Inventors: Masayuki Koyama; Naohiro Kobayashi, both of Tokyo, Japan

[73] Assignee: Mitsubishi Denki Kabushiki Kiasha, Tokyo, Japan

[21] Appl. No.: 08/872,155

[22] Filed: Jun. 10, 1997

[30] Foreign Application Priority Data

Feb. 21, 1997 [JP] Japan .................................. 9-037682

[51] Int. Cl.⁶ .................................................. H03M 13/00
[52] U.S. Cl. ........................................... 714/782; 714/784
[58] Field of Search ........................... 371/37.07, 37.08, 371/37.11, 40.11, 40.12; 714/782, 784

[56] References Cited

U.S. PATENT DOCUMENTS

| | | | |
|---|---|---|---|
| 5,490,154 | 2/1996 | Mester | 371/37.11 |
| 5,537,429 | 7/1996 | Inoue | 371/37.4 |
| 5,600,662 | 2/1997 | Zook | 371/40.14 |

FOREIGN PATENT DOCUMENTS

| | | |
|---|---|---|
| 2-303221 | 12/1990 | Japan . |
| 6-37649 | 2/1994 | Japan . |
| 6-276106 | 9/1994 | Japan . |
| 6-290065 | 10/1994 | Japan . |

*Primary Examiner*—Albert De Cady
*Assistant Examiner*—Shelly A Chase
*Attorney, Agent, or Firm*—Burns, Doane, Swecker & Mathis, LLP

[57] ABSTRACT

A bidirectional FILO capable of continuously performing the function of the FILO for different groups of codes is used to reduce a circuit scale of a Reed-Solomon error correcting device. Coefficients of an error-locator polynomial $\delta(x)$ and an error-evaluator polynomial $\omega(x)$ obtained by using a Euclid method are obtained in order from a final digit of a code to a first digit thereof. Correspondingly, a corrector starts a Chien search in order from a final byte of the code to a first byte thereof. In response to the order of the search, each group of data RSIN (Reed-Solomon Input) having digit order reversed in a bidirectional FILO are given to the corrector. The code corrected by the corrector also has digit order reversed. Therefore, the digit order is returned to original order in the bidirectional FILO for returning digit order to original order, so that a code RSOUT (Reed-Solomon Input) is output. The bidirectional FILOs can be implemented by operation of a shift register type, for example.

18 Claims, 34 Drawing Sheets

ERROR CORRECTING DEVICE

BACKGROUND OF THE INVENTION

1. Field of the Invention

The present invention relates to an error correcting device, and more particularly to an error correcting device based on a decoding method in which coefficients of an error-locator polynomial and an error-evaluator polynomial are obtained in order from the final digit of a code to the first digit thereof.

2. Description of the Background Art

FIG. 57 is a block diagram showing a structure of a Reed-Solomon error correcting device 200 according to the background art. Data RSIN of a Reed-Solomon code input to the Reed-Solomon error correcting device 200 is used to obtain a syndrome from a syndrome generator 1. A predetermined processing is performed for the syndrome in a polynomial generator 2 so that an error-locator polynomial δ(x) and an error-evaluator polynomial ω(x) are obtained.

In the polynomial generator 2, however, in the case where the error-locator polynomial δ(x) and the error-evaluator polynomial ω(x) are obtained by using a Euclid method, for example, their coefficients are obtained in order from a final digit of a code to a first digit thereof. In a corrector 3 for performing a Chien search, accordingly, it is necessary to start the search in order from the final byte of the code to the first byte thereof.

Correspondingly, in the case where the data RSIN is given to the corrector 3, it is necessary to reverse the order of digits for each group of codes. FILO (First In Last Out) type memories 61 and 62 and a demultiplexer 71 and a multiplexer 72 are provided to change the order of the digits for the data RSIN.

Errors of the data RSIN thus obtained and having the order of digits reversed are corrected by the corrector 3 on the basis of the coefficients of the error-locator polynomial δ(x) and the error-evaluator polynomial ω(x) and an element of Galois. The corrected code also has the order of digits reversed. Therefore, FILO type memories 41 and 42, a demultiplexer 73 and a multiplexer 74 are provided to return the order of digits to original order. A code RSOUT obtained after correction is output by the multiplexer 74.

A FILO type memory according to the background art (hereinafter referred to as a "FILO") operates by pushing and popping. In the case where only one FILO is used, a second set of data cannot be processed of FILO immediately after a first set of data are processed of FILO. The reason is that the first set of data are destroyed if another set of data are input to the FILO before the first set of data are completely read. Consequently, a plurality of Reed-Solomon codes which are continuously received cannot be processed.

Accordingly, the FILOs 41, 42, 61 and 62 output data in order reverse to the order of sequential data input, and should be provided in pairs as shown in FIG. 57.

The data RSIN are distributed every group of Reed-Solomon codes by the demultiplexer 71 and are given to the FILOs 61 and 62. Any of outputs is sent to the corrector 3 by the multiplexer 72. For example, in the case where the demultiplexer 71 gives, to the FILO 61, the data RSIN corresponding to a first group of Reed-Solomon codes, the multiplexer 72 gives the contents stored in the FILO 62 to the corrector 3. At the same time that the demultiplexer 71 gives, to the FILO 62, the data RSIN corresponding to a second group of Reed-Solomon codes, the data RSIN corresponding to the first group of Reed-Solomon codes are given from the FILO 61 to the corrector 3 through the multiplexer 72 in reverse order of digits. So do the FILOs 41 and 42, the demultiplexer 73 and the multiplexer 74.

In the background art, a pair of FILOs which are alternately selected should be used to continuously perform the processings of the FILOs for plural sets of data. Accordingly, a region for storing data should be twice as much as a set of data. Finally, the conventional Reed-Solomon error correcting device 200 including a FIFO (First In First Out) type memory 5 provided for matching a delay with that of the syndrome generator 1 needs a storage unit which is five times as much as a code length (wherein it is supposed that one storage unit stores one byte).

SUMMARY OF THE INVENTION

A first aspect of the present invention is directed to an error correcting device comprising a polynomial generator for obtaining coefficients of an error-locator polynomial and an error-evaluator polynomial of an error correcting code in order from a final digit of the code to a first digit of the code, a first bidirectional transfer type memory for reversing a string of data forming the error correcting code, a corrector for correcting the error correcting code based on an output of the polynomial generator and an output of a reversing section, and a second bidirectional transfer type memory for reversing a string of data output from the corrector. At least one of the first and second bidirectional transfer type memories has 0th to (N+K−1)th storage units (N≧2, K≧0) each for storing data having a predetermined length, input data form sets, each set having N input data, and are alternately input to the 0th and (N+K−1)th storage units, respective first data of two of the sets are opposed to each other through the K storage units, and shift transfer is sequentially performed (N+K−1) times for the data stored in the 0th to (N+K−1)th storage units, and directions of the shift transfer are alternately reversed so that the input data are switched back and output.

A second aspect of the present invention is directed to the error correcting device as defined in the first aspect of the present invention, wherein the input data are stored in the 0th storage unit if a control signal has a first value, and are stored in the Nth storage unit if the control signal has a second value, contents stored in the 0th to (N+K−2)th storage units are transferred to the 1st to (N+K−1)th storage units if the control signal has the first value, and contents stored in the 1st to (N+K−1)th storage units are transferred to the 0th to (N+K−2)th storage units if the control signal has the second value, the contents stored in the (N+K−1)th storage unit are employed as output data if the control signal has the first value, and the contents stored in the 0th storage unit are employed as the output data if the control signal has the second value, and the control signal is set to the second value corresponding to a first event that the input data are continuously written to the 0th storage unit N times, and is set to the first value corresponding to a second event that the input data are continuously written to the (N+K−1)th storage unit N times.

A third aspect of the present invention is directed to an error correcting device comprising a polynomial generator for obtaining coefficients of an error-locator polynomial and an error-evaluator polynomial of an error correcting code in order from a final digit of the code to a first digit of the code, a first bidirectional transfer type memory for reversing a string of data forming the error correcting code, a corrector for correcting the error correcting code based on an output of the polynomial generator and an output of a reversing section, and a second bidirectional transfer type memory for reversing a string of data output from the corrector. At least one of the first and second bidirectional transfer type memories includes a memory having 0th to (N+K−1)th storage units corresponding to 0th to (N+K−1)th addresses (N≧2, K≧0), and serving to operate in response to a clock, and an address generating section for generating read and write addresses of the memory, respectively, wherein each of the storage units stores data having a predetermined length, and input data form sets, each set having N input data, the input data are written following reading of contents stored in the storage units, and directions of movement of the read and write addresses are reversed corresponding to update of the sets.

A fourth aspect of the present invention is directed to the error correcting device as defined in the third aspect of the present invention, wherein the read address of the memory is set greater than the write address by the K and both the read address and the write address are increased by 1 in response to the clock if a control signal has a first value, the read address is set smaller than the write address by the K and both the read address and the write address are decreased by 1 in response to the clock if the control signal has a second value, the control signal is set to the second value corresponding to a first case where the write address specifies the (N−1)th storage unit, and is set to the first value corresponding to a second case where the write address specifies the Kth storage unit, the write address and the read address are set to the (N+K−1)th address and the (N−1)th address respectively writing into the (N−1)th storage unit, and the write address and the read address are set to the 0th address and the Kth address respectively after the write is performed for the Kth storage unit.

A fifth aspect of the present invention is directed to the error correcting device as defined in the fourth aspect of the present invention, wherein write and read of the memory are performed in response to rise and fall of the clock respectively, and the write and read addresses are successively updated after the write of the memory.

According to the first aspect of the present invention, in at least one of the first and second bidirectional transfer type memories, the directions in which a pair of input data are switched back and output are reverse to each other. By using (N+K) storage units, therefore, the function of FILO can continuously be displayed for a plurality of sets, each set having N data. Thus, an error correcting device having a circuit scale reduced can be obtained.

According to the second aspect of the present invention, in at least one of the first and second bidirectional transfer type memories, a set of data A1, A2, . . . , A(N−1) and AN are sequentially input to the 0th storage unit and are transferred to the 1st to (N−1)th storage units in this order if the control signal has the first value, for example. Then, the control signal is changed to have the second value so that the data AN, A(N−1), . . . , A2 and A1 are sequentially read from the 0th storage unit, and a next set of data B1, B2, . . . , B(N−1) and BN are sequentially input to the (N+K−1)th storage unit and are transferred to the (N+K−2)th to Kth storage units in this order. Thereafter, the control signal is changed to have the first value so that the data BN, B(N−1), . . . , B2 and B1 are sequentially read from the (N+K−1)th storage unit.

Thus, directions of data transfer among the storage units are reversed to each other. Consequently, by using the (N+K) storage units, the function of FILO can continuously be displayed for plural sets, each set having N data. Thus, effects according to the first aspect of the present invention can be obtained.

According to the third aspect of the present invention, in at least one of the first and second bidirectional transfer type memories, when the data are written to the storage units in one direction, they are read from the storage units in a reverse direction and new data are written following the read. Accordingly, the function of FILO can continuously be displayed for plural sets, each set having N data. Consequently, an error correcting device having a circuit scale reduced can be obtained.

According to the fourth aspect of the present invention, in at least one of the first and second bidirectional transfer type memories, a set of data A1, A2, . . . , A(N−1) and AN are sequentially stored in the 0th to (N−1)th storage units if the control signal has the first value. Then, the control signal is changed to have the second value so that the data AN, A(N−1), . . . , A2 and A1 are sequentially read from the (N−1)th to 0th storage units, while a next set of data B1, B2, . . . , B(N−1) and BN are sequentially input to the (N+K−1)th to Kth storage units. Thereafter, the control signal is changed to have the first value so that the data BN, B(N−1), . . . , B2 and B1 are sequentially read from the Kth to (N+K−1)th storage units.

Thus, the data are input and output among the storage units by address operation in two directions reverse to each other. By utilizing an ordinary memory having (N+K) storage units, therefore, the function of FILO can continuously be displayed for plural sets, each set having N data. Thus, effects according to the third aspect of the present invention can be obtained.

According to the fifth aspect of the present invention, in at least one of the first and second bidirectional transfer type memories, processing of write, updating of address and processing of read are performed in this order. Therefore, the effects according to the third aspect of the present invention can particularly be obtained also in the case where K is equal to 0. Consequently, the storage units of the memory can be utilized most efficiently. Thus, the effects according to the third aspect of the present invention can be enhanced most.

In order to solve the above-mentioned problems, it is an object of the present invention to provide a Reed-Solomon error correcting device in which a circuit scale can be reduced by using a bidirectional FILO capable of transferring data bidirectionally, that is, in a direction from top to bottom and a direction from bottom to top between a plurality of memory elements to reduce a region for storing the data and continuously perform the function of FILO.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
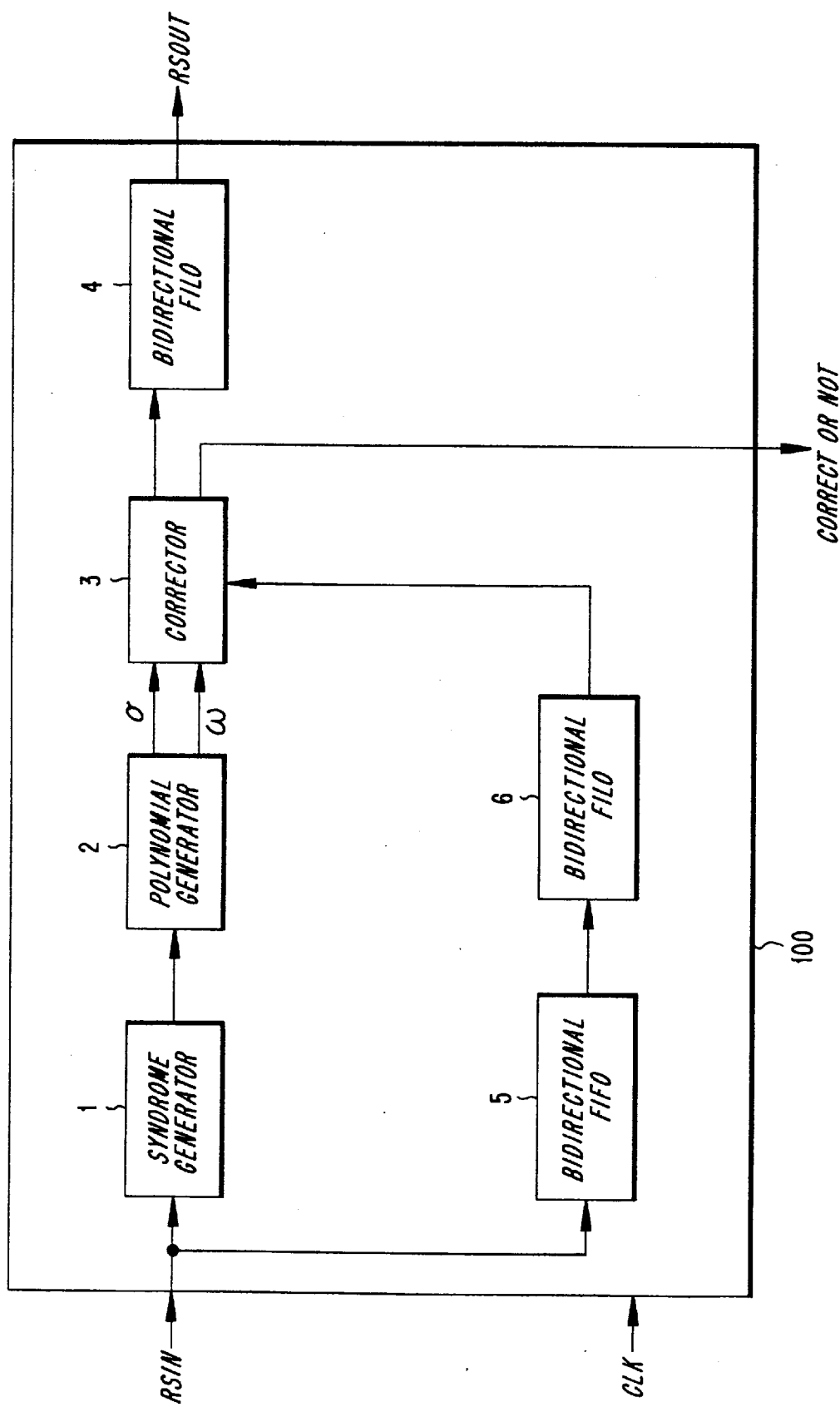
FIG. 1 is a block diagram illustrating a structure of a Reed-Solomon error correcting device 100 according to the present invention.

A. Reed-Solomon Error Correcting Device:

FIG. 1 is a block diagram illustrating a structure of a Reed-Solomon error correcting device 100 according to the present invention. Data RSIN of a Reed-Solomon code and a clock CLK are input to the Reed-Solomon error correcting device 100. The data RSIN is given to a syndrome generator 1 and a FIFO 5 for matching a delay time with that of the syndrome generator 1.

The syndrome generator 1 obtains a syndrome from the data RSIN. In a polynomial generator 2, an error-locator polynomial $\delta(x)$ and an error-evaluator polynomial $\omega(x)$ are obtained for the syndrome by using a Euclid method, for example. In the polynomial generator 2, coefficients of the error-locator polynomial $\delta(x)$ and the error-evaluator polynomial $\omega(x)$ are obtained in order from the final digit of the code to the first digit thereof. In a corrector 3 for performing a Chien search, the search is started in order from a final byte of the code to a first byte thereof.

For example, the case where a manner of representing RS (204, 188, 17) is employed as the Reed-Solomon code will be described below. In this case, a group of Reed-Solomon codes has 204 bytes in which a data has 188 byte (so that residual 16 bytes are parity checking symbols). A distance between the codes is (2t+1=) 17 bytes. Consequently, error correction for (t=) 8 bytes can be performed.

As an example in which the Reed-Solomon code in such a manner is formed on the basis of a Galois field GF ($2^8$), P $(x)=x^8+x^4+x^3+x^2+1$ and $G(x)=(x-\alpha^0)\cdot(x-\alpha^1)\ldots(x-\alpha^{15})$ can be employed for a primitive polynomial and a generating polynomial, respectively. In this case, $\alpha^0$, $\alpha^{-1}$, $\alpha^{-2}$, $\alpha^{-3}$, $\alpha^{-4}$, $\alpha^{-5}$, $\alpha^{-6}$, $\alpha^{-7}$, and $\alpha^{-8}$ are represented in hexadecimal numbers. Consequently, 1, 8e, 47, ad, d8, 6c, 36, 1b and 83 are obtained.

The corrector 3 fetches respective coefficients sigm0 to sigm8, and omeg0 to omeg7 of an error-locator polynomial $\delta(x)$ of t-th degree and an error-evaluator polynomial $\omega(x)$ of (t−1)th degree. This operation is performed in response to a signal sync indicative of arrival of a group of Reed-Solomon codes. While the signal sync indicative of arrival of a next group of Reed-Solomon codes is not activated, Galois multiplication is performed by using $\alpha^{-p}$ and $\alpha^{-q}$ for coefficients sigmp and omegq for each clock CLK (p=0 to 8, q=0 to 7). Results of the multiplication are stored in sigm [8:0] and omeg [7:0]. More specifically, the following operation is performed.

$$\text{sigm}[0] = \text{mult}(\text{sync ? sigm}[0]: \text{sigm0}, 8'\text{h01}); \quad [\text{Equation 1}]$$
$$\text{sigm}[1] = \text{mult}(\text{sync ? sigm}[1]: \text{sigm1}, 8'\text{h8e});$$
$$\text{sigm}[2] = \text{mult}(\text{sync ? sigm}[2]: \text{sigm2}, 8'\text{h47});$$
$$\text{sigm}[3] = \text{mult}(\text{sync ? sigm}[3]: \text{sigm3}, 8'\text{had});$$
$$\text{sigm}[4] = \text{mult}(\text{sync ? sigm}[4]: \text{sigm4}, 8'\text{hd8});$$
$$\text{sigm}[5] = \text{mult}(\text{sync ? sigm}[5]: \text{sigm5}, 8'\text{h6c});$$
$$\text{sigm}[6] = \text{mult}(\text{sync ? sigm}[6]: \text{sigm6}, 8'\text{h36});$$
$$\text{sigm}[7] = \text{mult}(\text{sync ? sigm}[7]: \text{sigm7}, 8'\text{h1b});$$
$$\text{sigm}[8] = \text{mult}(\text{sync ? sigm}[8]: \text{sigm8}, 8'\text{h83});$$
$$\text{omeg}[0] = \text{mult}(\text{sync ? omeg}[0]: \text{omeg0}, 8'\text{h01});$$
$$\text{omeg}[1] = \text{mult}(\text{sync ? omeg}[1]: \text{omeg1}, 8'\text{h8e});$$
$$\text{omeg}[2] = \text{mult}(\text{sync ? omeg}[2]: \text{omeg2}, 8'\text{h47});$$
$$\text{omeg}[3] = \text{mult}(\text{sync ? omeg}[3]: \text{omeg3}, 8'\text{had});$$
$$\text{omeg}[4] = \text{mult}(\text{sync ? omeg}[4]: \text{omeg4}, 8'\text{hd8});$$
$$\text{omeg}[5] = \text{mult}(\text{sync ? omeg}[5]: \text{omeg5}, 8'\text{h6c});$$
$$\text{omeg}[6] = \text{mult}(\text{sync ? omeg}[6]: \text{omeg6}, 8'\text{h36});$$
$$\text{omeg}[7] = \text{mult}(\text{sync ? omeg}[7]: \text{omeg7}, 8'\text{h1b});$$

A mark "mult" indicates that the Galois multiplication is performed. An expression of "sync ?" represents that a variable sigm[p] (or omeg[q]) indicated on a left side of a colon is multiplied by a coefficient $\alpha^{-p}$ (or $\alpha^{-q}$) indicated on a right side of a comma when the signal "sync" is activated, and a coefficient sigmp of an error-locator polynomial $\delta(x)$ indicated on a right side of a colon (or a coefficient omegq of an error-evaluator polynomial $\delta(x)$) is multiplied by the coefficient $a^{-p}$ (or $\alpha^{-q}$) indicated on the right side of the comma when the signal sync is deactivated. By performing such Galois multiplication, the corrector 3 executes a search in order from the final byte of the code to the first byte thereof.

The data RSIN is input to a bidirectional FILO 6 through the FIFO 5 so that the order of digits is reversed and given to the corrector 3 every group of Reed-Solomon codes. Consequently, the corrector 3 can correct errors of the Reed-Solomon codes to be output. In the corrector 3, information on whether correction can be performed or not is also obtained. This information can be transmitted to an outside of the Reed-Solomon error correcting device 100.

The corrected code also has order of digits reversed. Therefore, the order of digits is returned to original order in the bidirectional FILO 4 for returning the reversed order to the original order. Thus, a code RSOUT obtained after correction is output from the Reed-Solomon error correcting device 100.

The following two kinds of structures of the bidirectional FILOs 4 and 6 can be illustrated. Either of the structures or different structures can be employed as FILOs 4 and 6.

B. Outline of Bidirectional FILO
First Embodiment

Figure 2:
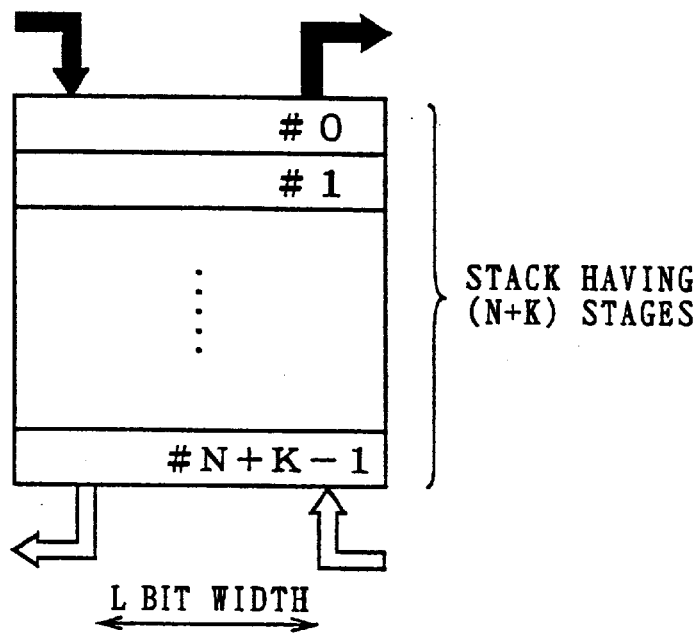
FIG. 2 is a conceptual diagram showing a structure of a shift register type bidirectional FILO which can be employed as a first embodiment of the present invention.

FIG. 2 is a conceptual diagram showing a structure of a shift register type bidirectional FILO which can be employed as a first embodiment of the present invention. Storage units #0 to #(N+K−1) each of which can store data having an L-bit width form a stack having (N+K) stages. For example, L=8 and N=204 are set, and integers of K≧0 can independently be set to L and N in the Reed-Solomon error correcting device 100.

Black and white arrows indicate inputs and outputs of different groups of Reed-Solomon codes to and from the bidirectional FILO, respectively. Data (corresponding to one of digits of the Reed-Solomon code) is sequentially input to the storage unit #0 as shown by the black arrow on a left side, and is sequentially shifted and transferred among the storage units in a direction to the storage unit #(N+K−1). At this time, the data transferred to the storage unit #(N+K−1) is sequentially read as shown by the white arrow on the left side.

Conversely, data is sequentially input to the storage unit #(N+K−1) as shown by the white arrow on a right side, and is sequentially shifted and transferred among the storage units in a direction to the storage unit #0. At this time, the data transferred to the storage unit #0 is sequentially read as shown by the black arrow on the right side.

Respective first addresses are opposed to each other through K storage units, and two sets of data of the different groups of Reed-Solomon codes are input and output in different directions of the bidirectional FILO in a so-called switchback manner. Consequently, the order of digits of the Reed-Solomon codes can continuously be changed also in the stack having (N+K) stages.

Accordingly, the shift register type bidirectional FILO is adopted into FILOs 3 and 4 with K=0 so that a storage unit having a capacity which is three times as much as a code length is required in the Reed-Solomon error correcting device 100. Thus, a circuit scale can be reduced.

Second Embodiment

Figure 3:
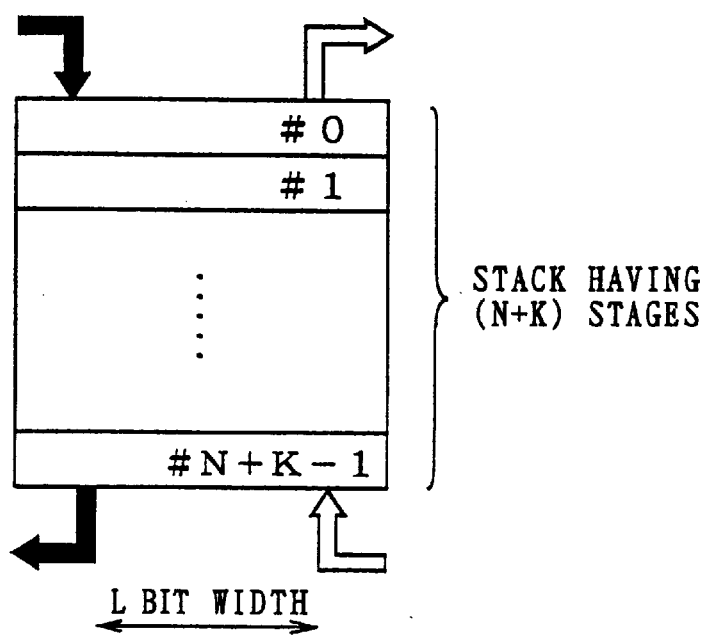
FIG. 3 is a conceptual diagram showing a structure of an address pointer type bidirectional FILO which can be employed as a second embodiment of the present invention.

FIG. 3 is a conceptual diagram showing a structure of an address pointer type bidirectional FILO which can be employed as a second embodiment of the present invention. Storage units #0 to #(N+K−1) each of which can store data having an L-bit width form a stack having (N+K) stages. For example, L=8 and N=204 are set, and integers of K≧0 can independently be set to L and N in the Reed-Solomon error correcting device 100.

Black and white arrows indicate directions of inputs and outputs of different groups of Reed-Solomon codes to and from the bidirectional FILO, respectively. Data is written and read in a direction shown by the black arrow on a left side. A read address proceeds more than a write address by K in a direction shown by the black arrow.

Conversely, data is written and read in a direction shown by the white arrow on a right side. A read address proceeds more than a write address by K in a direction shown by the white arrow.

Thus, a processing of writing new data immediately after reading old data is repeated bidirectionally in a shuttle manner. Consequently, order of digits of the Reed-Solomon code can continuously be changed also in a stack having (N+K) stages.

Accordingly, the shift register type bidirectional FILO is adopted into FILOs 3 and 4 with K=0 so that a storage unit having a capacity which is three times as much as a code length is required in the Reed-Solomon error correcting device 100. Thus, a circuit scale can be reduced.

C. Additional Function of Bidirectional FILO

Third Embodiment

Figure 4:
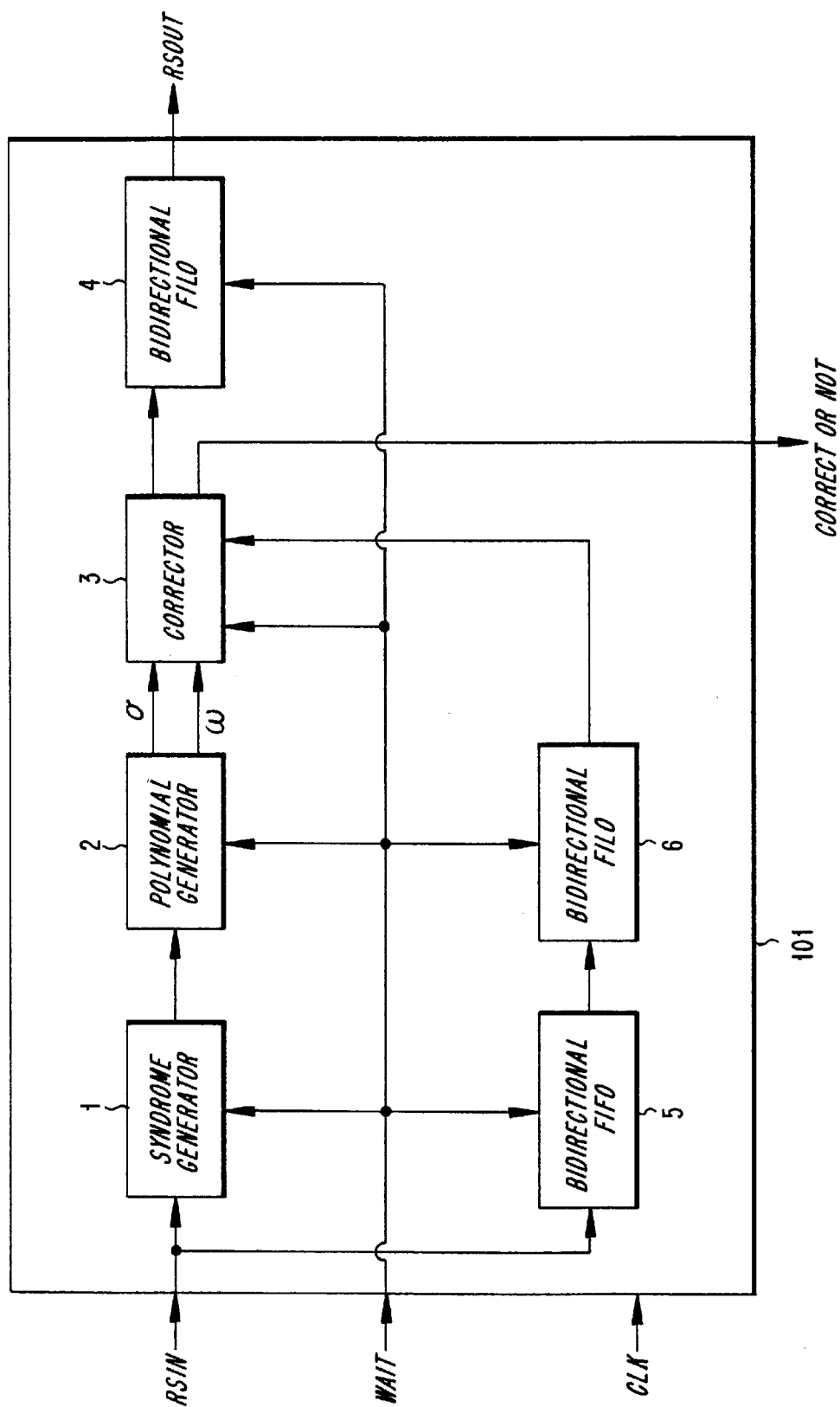
FIG. 4 is a block diagram illustrating a structure of a Reed-Solomon error correcting device 101 according to a third embodiment of the present invention.

FIG. 4 is a block diagram illustrating a structure of a Reed-Solomon error correcting device 101 according to a third embodiment of the present invention. The Reed-Solomon error correcting device 101 differs from the Reed-Solomon error correcting device 100 in that the function of waiting for a processing in response to a wait instruction WAIT is added.

By waiting for the processing in response to the wait instruction WAIT, operation can be performed with excellent matching properties even if a processing speed of the Reed-Solomon error correcting device 101 is higher than a transmission speed of data RSIN.

Apart from waiting operation of a syndrome generator 1, a polynomial generator 2 and a corrector 3 which has conventionally be well-known, waiting operation of a bidirectional FILO which becomes clear in the present specification has not been known. Accordingly, the specific operation and structure of the bidirectional FILO will be described below in detail together with the waiting operation.

Figure 5:
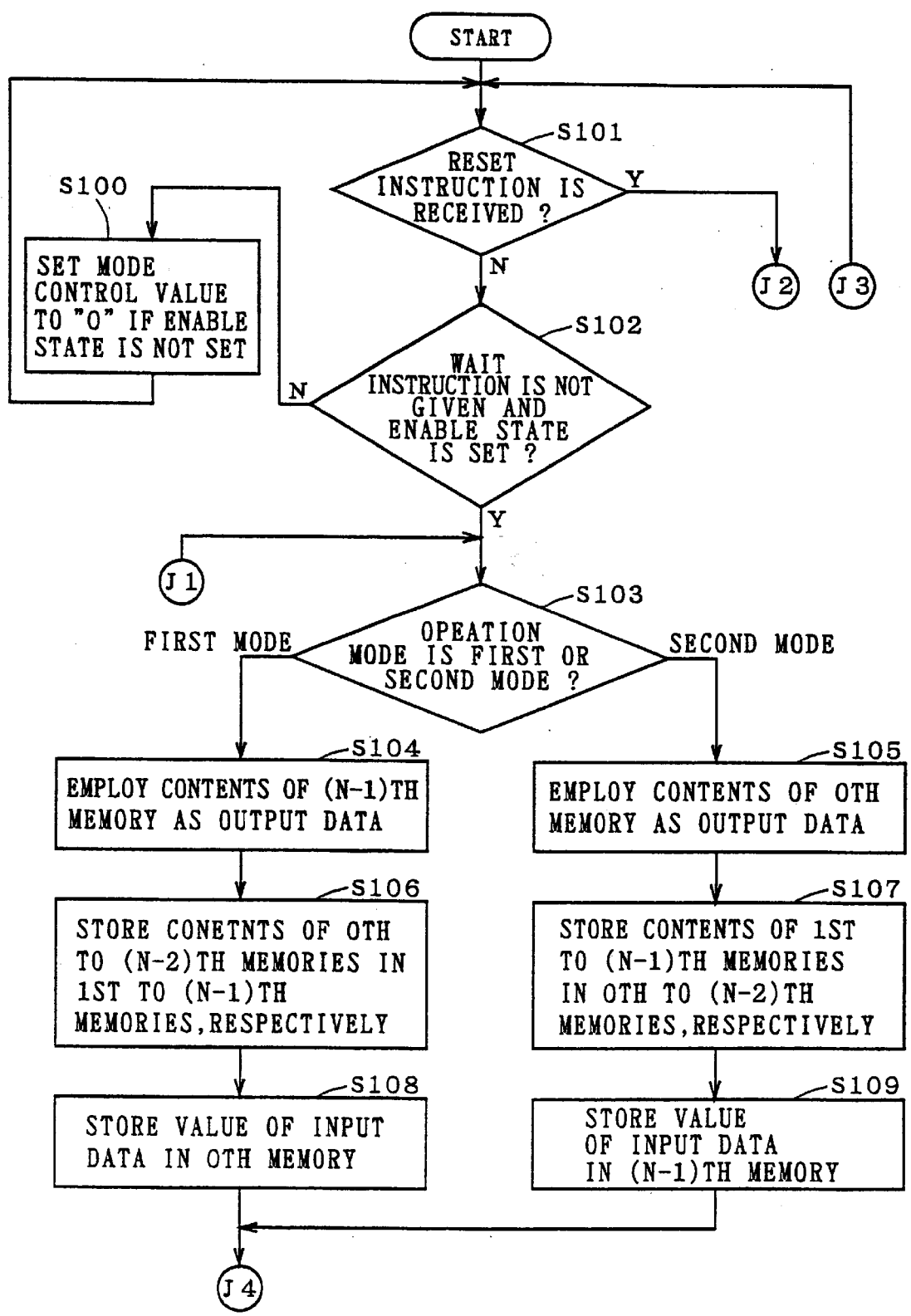
FIGS. 5 and 6 are flowcharts together showing operation of the shift register type bidirectional FILO.
Figure 6:
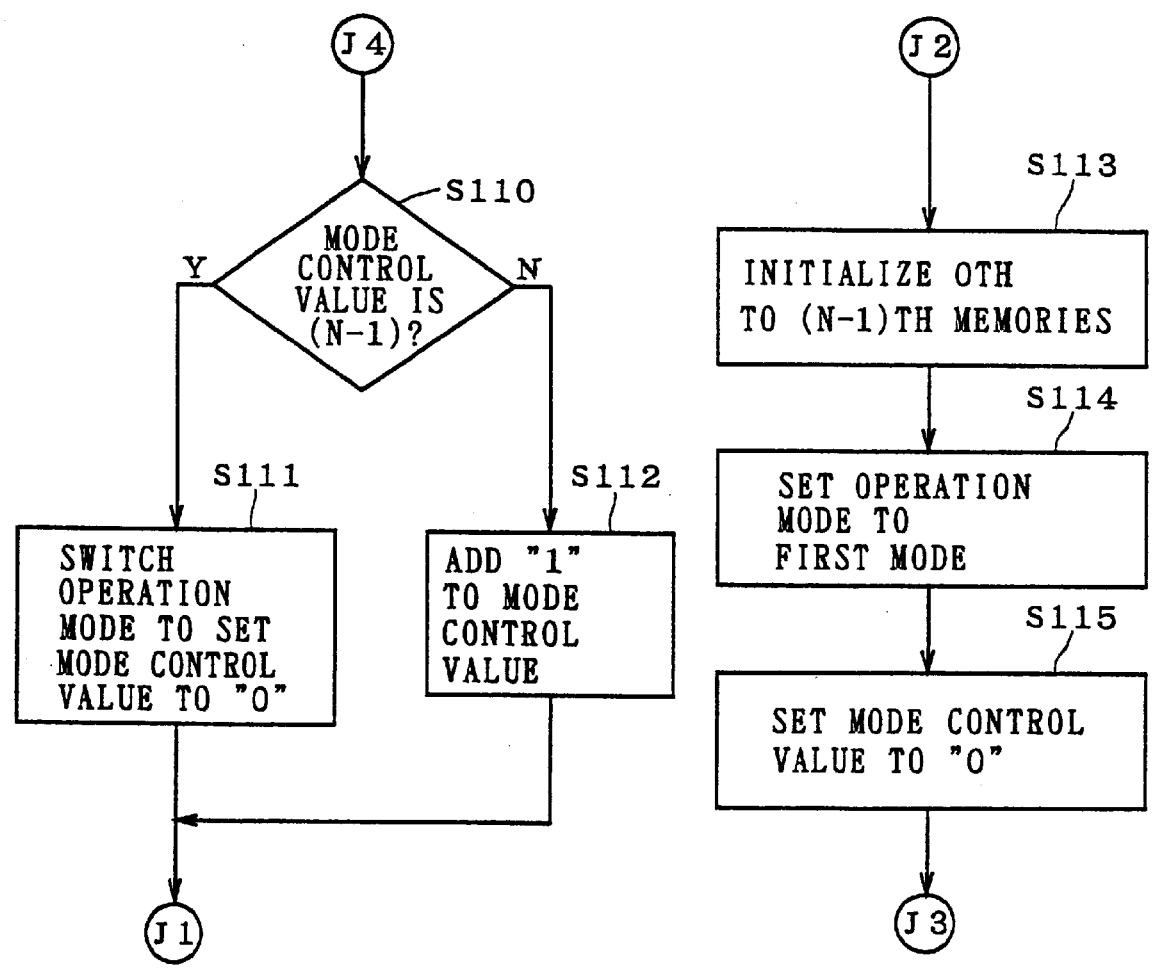
Figure 7:
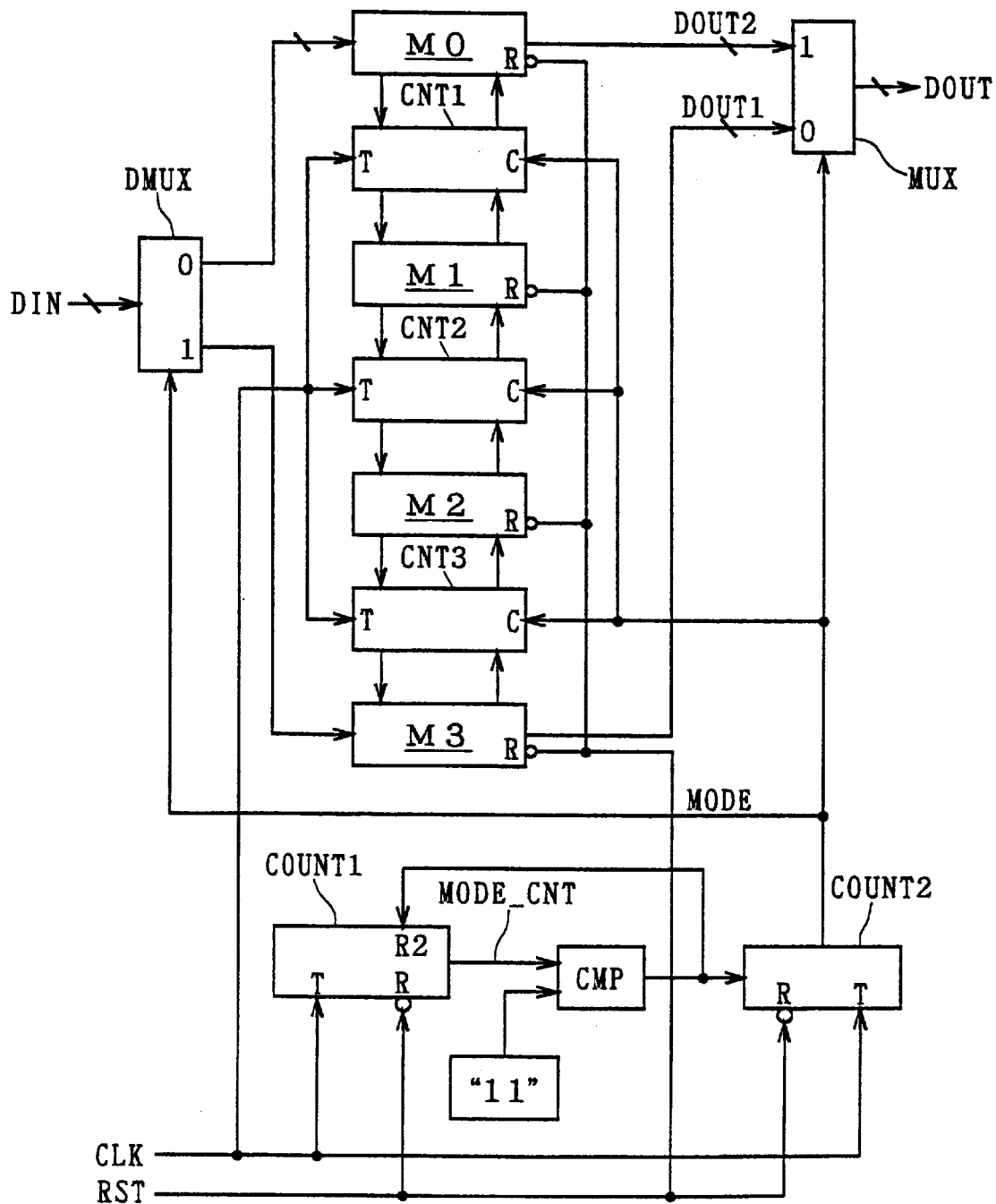
FIG. 7 is a block diagram illustrating a structure of the shift register type bidirectional FILO.

D. Specific Structure and Operation of Bidirectional FILO:

(d−1) Shift Register Type Bidirectional FILO;

FIGS. 5 and 6 are flowcharts together showing operation of a shift register type bidirectional FILO. FIGS. 5 and 6 are connected to each other by connectors J1 to J4. FIG. 7 is a block diagram illustrating a structure of the shift register type bidirectional FILO. FIGS. 8 to 20 are typical diagrams showing, in order, the operation of the bidirectional FILO in FIG. 7.

The bidirectional FILO shown in FIG. 7 comprises memories M0 to M3 forming a shift register, and control sections CNT1 to CNT3 for sequentially transferring data among the memories M0 to M3. More specifically, the control section CNT1 transfers data between the memories M0 and M1, the control section CNT2 transfers data between the memories M1 and M2, and the control section CNT3 transfers data between the memories M2 and M3. The control sections CNT1 to CNT3 operate synchronized with a clock CLK. The data is transferred in a direction from top to bottom (from M0 to M3) and a direction from bottom to top (from M3 to M0) in response to values "0" and "1" of a mode signal MODE, respectively.

A demultiplexer DMUX and a multiplexer MUX performs output and input on the basis of the value of the mode signal MODE. More specifically, the demultiplexer DMUX receives input data DIN, and outputs the input data DIN to output terminals having "0" and "1" appended thereto (hereinafter referred to as a "0" output terminal and a "1" output terminal) in response to the values "0" and "1" of the mode signal MODE, respectively. The multiplexer MUX outputs, as output data DOUT, data DOUT1 and DOUT2 input to input terminals having "0" and "1" appended thereto (hereinafter referred to as a "0" input terminal and a "1" input terminal) in response to the values "0" and "1" of the mode signal MODE. The data DOUT1 and DOUT2 are stored in the memories M3 and M0, respectively.

The mode signal MODE is generated by counters COUNT1 and COUNT2 and a comparator CMP. The counter COUNT1 counts a clock CLK to generate a mode control value MODE_CNT. The comparator CMP compares the mode control value MODE_CNT with a predetermined value, for example, a 2-bit value "11" ("3" in a decimal number). The mode control value MODE_CNT designates order of a memory for storing the input data DIN in a direction of movement of the data. In the case where the mode control value MODE_CNT is coincident with a predetermined value (which means that the memory M3 stores the input data DIN if the mode signal MODE has the value of "0" and the memory M0 stores the input data DIN if the mode signal MODE has the value of "1"), the counter COUNT1 is reset to set the mode control value MODE_CNT to "0" and to cause the counter COUNT2 to perform counting. The counter COUNT2 is a 1-bit counter which does not count the clock CLK but counts an output of the comparator CMP. A timing in which a value of the mode signal MODE output from the counter COUNT2 is changed synchronized with the clock CLK.

The counter COUNT1 has a reset terminal R2 for performing reset in response to the output of the comparator CMP, and a reset terminal R for performing reset in response to a reset signal RST used for reset of the bidirectional FILO. Similarly, the counter COUNT2 also has a reset terminal R for performing reset in response to the reset signal RST. The memories M0 to M3 also have reset terminals R for performing reset in response to the reset signal RST.

In the flowchart shown in FIG. 5, step S101 is executed irrespective of the clock CLK. At step S101, it is decided whether a reset instruction is given or not. In conformity with FIG. 7, it is decided whether the reset signal RST falls or not. If the reset instruction is given (the reset signal RST falls), steps S113 to S115 shown in FIG. 6 are executed through the connector J2, and the routine returns to step S101 again through the connector J3.

At steps S113 to S115, processings of resetting the bidirectional FILO are executed. At step S113, the contents of 0th to (N−1)th memories, that is, those of all the memories are initialized. In conformity with FIG. 7, N is equal to 4. A transition from "H" to "L" is given to the reset terminal R so that the contents of the memories M0 to M3 are cleared. At step S114, an operation mode is set to a first mode. In conformity with FIG. 7, this indicates that the value of the mode signal MODE is set to "0" by giving the transition from "H" to "L" to the reset terminal R of the counter COUNT2. At step S115, similarly, the transition from "H" to "L" is given to the reset terminal R of the counter COUNT1 so that the mode control value MODE_CNT is set to "0".

Referring to steps S102 and S100 shown in FIG. 5, a corresponding mechanism is not particularly provided in the bidirectional FILO shown in FIG. 7. The memory is usually managed by using a wait instruction WT and an enable instruction EN, and the mechanism can also be implemented by a well-known technique.

At step S103, it is decided whether the operation mode is a first mode or a second mode. The first and second modes correspond to the values "0" and "1" of the mode signal MODE, respectively. Consequently, the control sections CNT1 to CNT3 transfer data in a direction from top to bottom and a direction from bottom to top. In the case where steps S113 to S115 are executed and step S103 is then executed for the first time, the mode signal MODE has the value of "0" as a result of execution of step S114. Thereafter, the routine proceeds to step S104.

Figure 8:
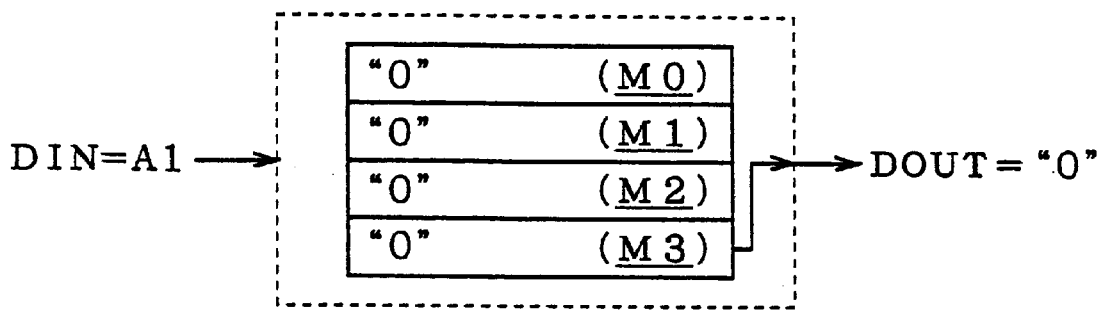
FIGS. 8 to 20 are typical diagrams showing, in order, operation of the bidirectional FILO illustrated in FIG. 7.

At step S104, the contents of an (N−1)th memory provided at the end are employed as output data. For this purpose, the multiplexer MUX employs data DOUT1 as output data DOUT corresponding to the value "0" of the mode signal MODE. FIG. 8 is a diagram showing this state. In the state where all the memories M0 to M3 are cleared to store "0", the output data DOUT adopts the contents (data DOUT1) stored in the memory M3.

Figure 9:
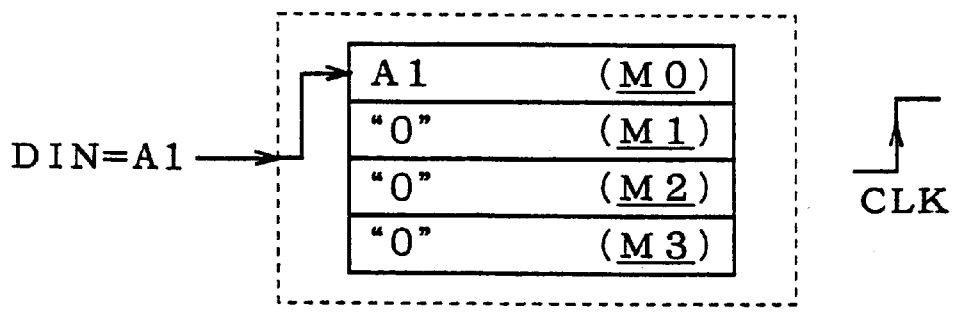

Steps S106, S108, S111 and S112 are executed synchronously with the clock CLK, for example, in response to a rise timing. At step S106, the contents of the 0th memory acting as a head memory to the (N−2)th memory acting as a second memory from the end are transferred to the 1st memory acting as a second memory from the head to the (N−1)th memory acting as an end memory. For this purpose, the control sections CNT1 to CNT3 transfer data in the direction from top to bottom among the memories M0 to M3. Accordingly, data "0", "0" and "0" stored in the memories M0 to M2 in FIG. 8 are stored in the memories M1 to M3, respectively. At step S108, a value of input data is stored in the 0th memory acting as a head memory. For example, if A1 is given as a value of the input data DIN, data A1 is stored in the memory M0. FIG. 9 shows the contents stored in the memories M0 to M3 which are thus obtained.

At step S110, the mode control value MODE-CNT is examined. In the state shown in FIG. 9, the value of the input data DIN is to be stored in the memory M0 and the mode control value MODE_CNT is "0". Consequently, the routine proceeds to step S112. At step S112, the mode control value MODE_CNT is increased by "1". This indicates that the memory for storing the input data DIN is sequentially moved. If the memory for storing input data DIN corresponds to the head or end memory (that is, the mode control value MODE_CNT equals to N−1), the routine proceeds from step S110 to step S111 where the value of the mode signal MODE is changed to modify the operation mode and set the mode control value MODE_CNT to "0". While the memory for storing the input data DIN does not correspond to the head or end memory, the routine returns to step S103 through the connector J1.

Figure 10:
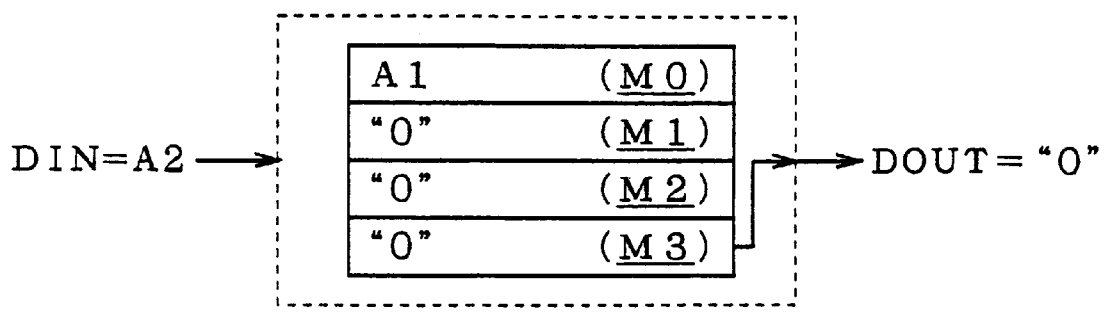
Figure 11:
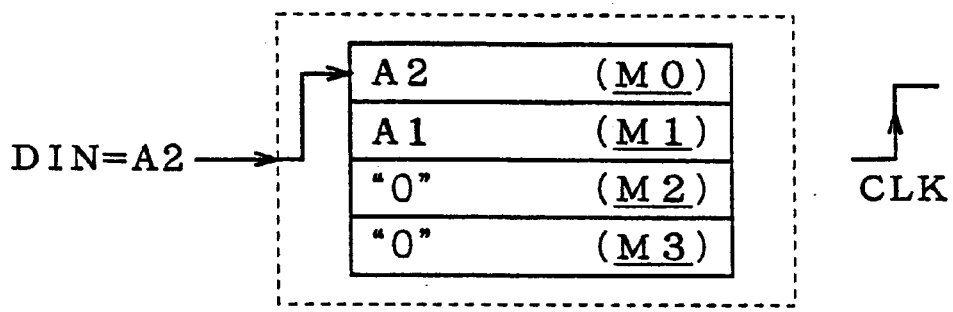
Figure 12:
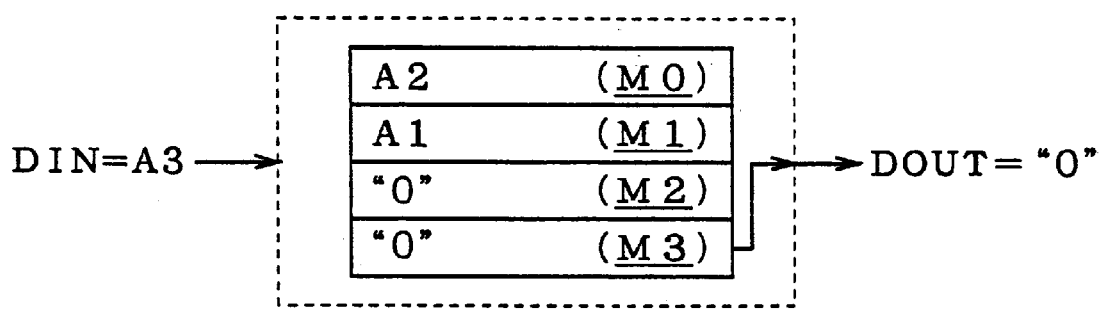

FIG. 10 shows the state in which step S104 is executed at a second time after step S114 is executed. In response to rise of the clock CLK, the data A1, "0" and "0" stored in the memories M0 to M2 in FIGS. 8 to 10 are stored in the memories M1 to M3 respectively (step S106), and a new value A2 of the input data DIN is stored in the memory M0 (step S108 in FIG. 11). At step S112, the mode control value MODE_CNT is increased, and is 2 in a decimal number and is not equal to N−1(=3). The routine returns from step S111 to step S104 through the connector J1 and step S103. FIG. 12 shows this state.

Figure 13:
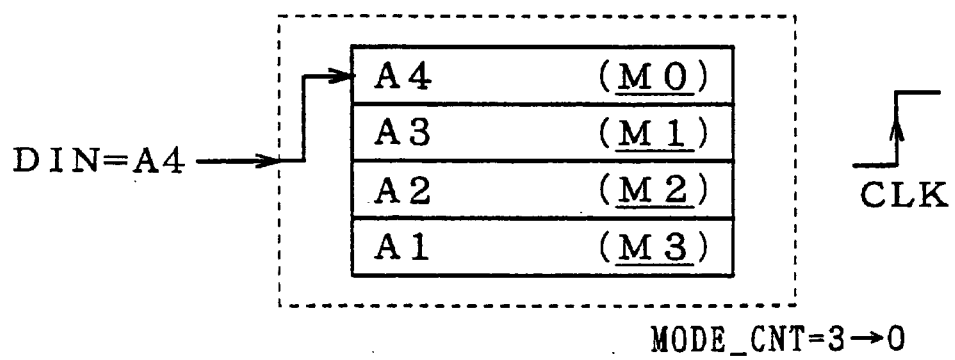

Such processings are repeated so that values A3 and A4 of the input data DIN which are sequentially updated are stored in the memory M0. At step S110 to be executed corresponding to the rise of the clock CLK when the data A4 is stored in the memory M0, the mode control value MODE_CNT has already been set to "3". Therefore, a processing of step S111 is executed. In other words, the mode control value MODE_CNT is set to "0" and the mode signal MODE is set to "1". For this purpose, in FIG. 7, the comparator CMP compares the mode control value MODE_CNT with a binary number "11". As a result, the counter COUNT1 is reset through the reset terminal R2, and the counter COUNT2 is caused to perform counting. FIG. 13 shows this state.

Figure 14:
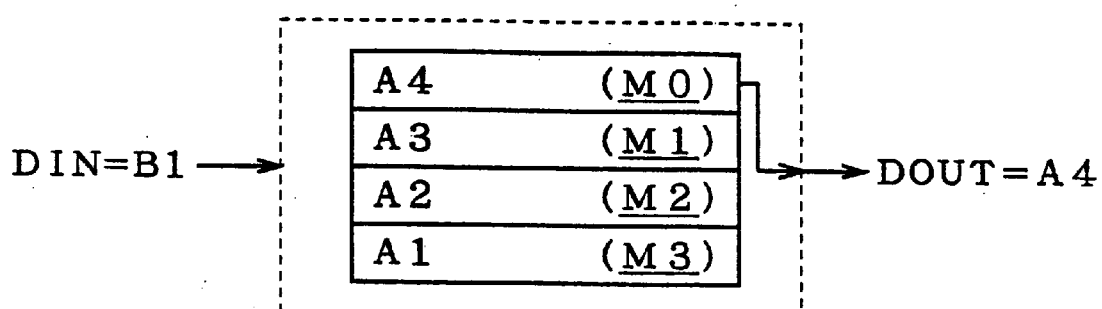

Immediately after the processing of step S111 is executed, it is decided that the operation mode is the second mode at step S103. The routines proceeds from step S103 to step S105. The contents of the 0th memory acting as the head memory are employed as the output data DOUT. For this purpose, the multiplexer MUX employs the data DOUT2 as the output data DOUT in response to the value "1" of the mode signal MODE. FIG. 14 shows this state. The output data DOUT adopts the data A4 stored in the memory M0.

Figure 15:
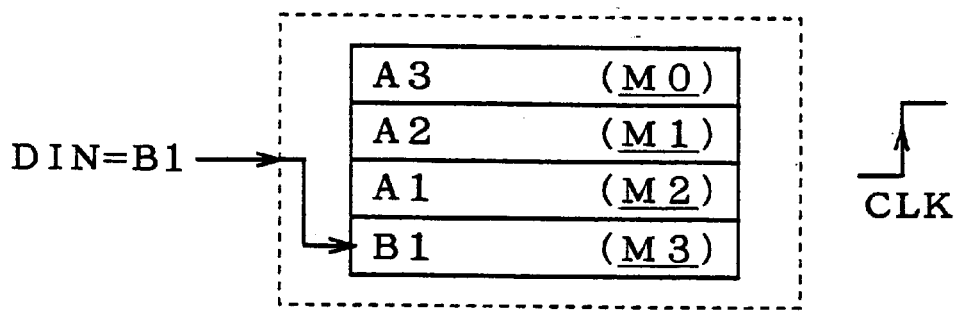

Steps S107 and S109 are executed synchronously with the clock CLK, for example, in response to a rise timing. At step S107, the contents of the 1st memory acting as a second memory from the head to the (N−1)th memory acting as the end memory are transferred from the 0th memory acting as the head memory to the (N−2)th memory acting as the second memory from the end. For this purpose, the control sections CNT1 to CNT3 transfer data in the direction from bottom to top among the memories M0 to M3. Accordingly, data A3, A2 and A1 stored in the memories M1 to M3 in FIG. 14 are stored in the memories M0 to M2 respectively. At step S109, a value of input data is stored in the (N−1)th memory acting as the end memory. For example, if B1 is given as a value of the input data DIN, data B1 is stored in the memory M3. FIG. 15 shows the contents stored in the memories M0 to M3 which are thus obtained.

Figure 16:
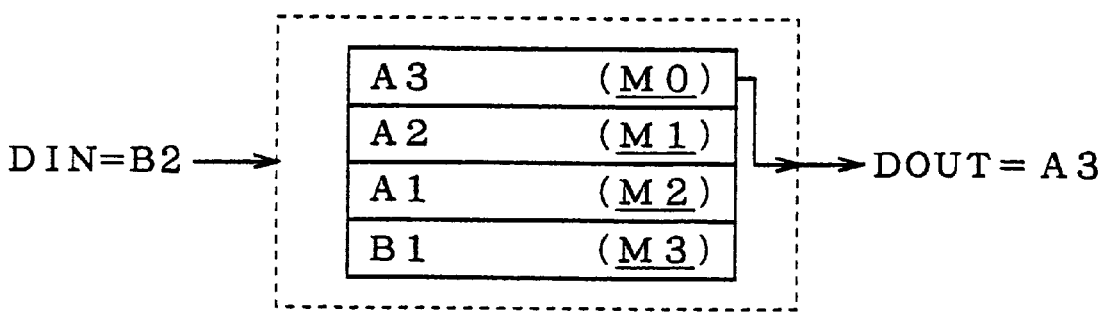
Figure 17:
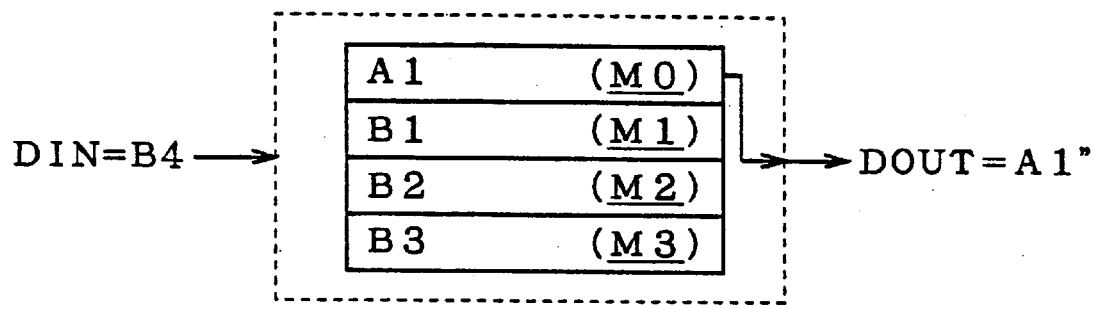
Figure 18:
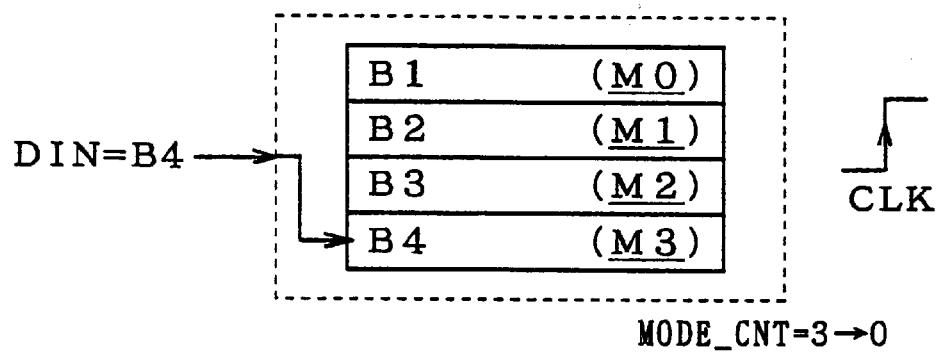

After step S109 is executed, steps S110 to S112 are executed in the same manner as in the first mode. Consequently, output data A3, A2 and A1 are sequentially obtained as shown in FIGS. 16 to 18. On the other hand, the contents of the memory M3 at the end are successively updated to new input data values B2, B3 and B4.

Figure 19:
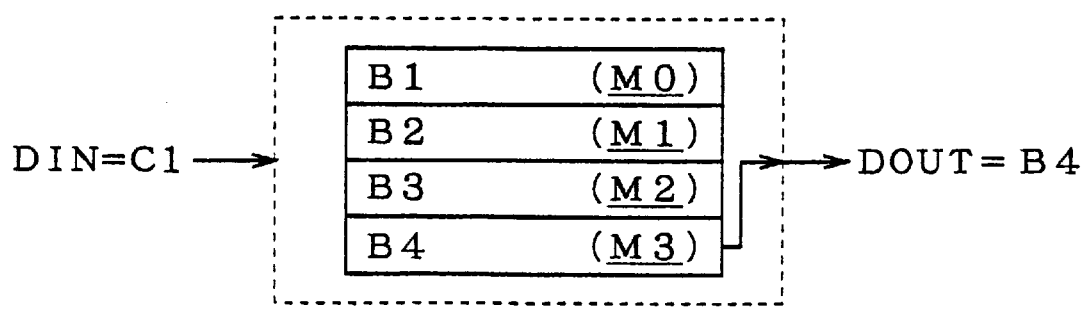
Figure 20:
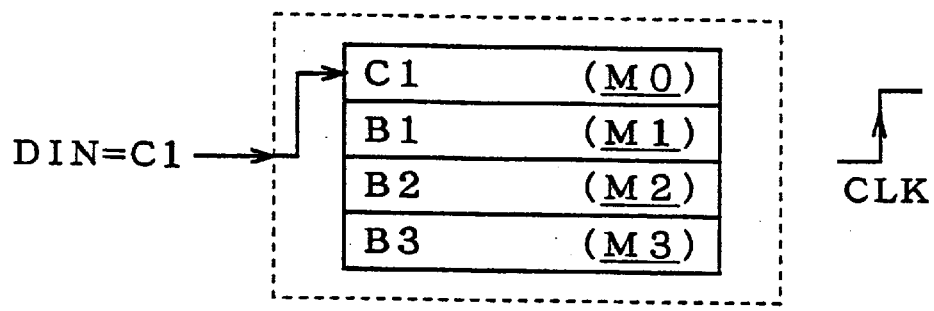

After the state shown in FIG. 18 is obtained by execution of step S109, step S111 is executed when the clock CLK rises. In the second mode, the value "3" is employed as the mode control value MODE_CNT because it is supposed that the memory M0 is specified. The operation mode is set to the first mode and the mode control value MODE_CNT is reset from "3" to "0". As shown in FIG. 19, then, a new value of the input data DIN is updated to C1 and the data B4 stored in the memory M3 is output as the output data DOUT (step S104). The data B1, B2 and B3 stored in the memories M0 to M2 are stored in the memories M1 to M3, respectively (step S106). Data C1 is stored in the memory M0 (step S108 in FIG. 20).

By sequentially employing, as the input data DIN, data (A1, A2, A3, A4), (B1, B2, B3, B4), . . . , each having a set of N values (N=4 in FIGS. 7 to 20), the output data DOUT (A4, A3, A2, A1), (B4, B3, B2, B1), . . . are obtained. In the bidirectional FILO comprising N memories, the function of FILO can continuously be displayed for a plurality of sets, each set having N data. The reason is that the data is transferred among N memories bidirectionally, that is, in the direction from top to bottom and the direction from bottom to top. In the following, the set having N data is sometimes handled in a unit of a packet.

While heads of different sets of data are adjacent to each other in the shift register type bidirectional FILO as shown in FIGS. 15 to 17, it is apparent that they may be opposed to each other with K ($\geq$0) storage units interposed therebetween. In that case, (N+K) storage elements are necessary. A value of N at steps S104, S106, S107, S109 and S113 is changed to (N+K), the above-mentioned effects can be obtained. Also in this case, the value of N at step S110 is kept.

By properly selecting to transfer data in either direction among the memories M0 to M3 forming a part of a shift register, to store the input data in the head or end memory or to read the output data from the head or end memory, the bidirectional FILO can be implemented. Accordingly, it is not necessary to distinguish the control sections CNT1 to CNT3 from the demultiplexer DMUX. A circuit in which such a distinction is not made will be described below. A positive logic is employed (in which "1" and "0" correspond to "H" and "L", respectively).

Table 1 shows a list using a hardware descriptive language (HDL) which describes the shift register type bidirectional FILO in this order. By way of example, Verilog-HDL manufactured by Cadence Co., Ltd. has been used.

TABLE 1

```
module bifilo1(clk, rst, en, wt, din, dout);
  input           clk, rst, en, wt;
  input    [1:0]  din;
  output   [1:0]  dout;
  wire     [1:0]  dout1, dout2;
  reg      [1:0]  filo[0:3];
  reg             mode;
  reg      [1:0]  mode_cnt;
  integer  i;
always @(posedge clk or negedge rst) begin
  if(!rst) begin
    for (i = 3; i >= 0; i=i−1) begin
      filo[i] <= 2'h0;
    end
    mode <= 1'b0;
    mode_cnt <= 2'h0;
  end else begin
    if(!wt αα en) begin
      case(mode)
      1'b0:begin
        for (i = 3; i > 0; i=i−1) begin
          filo[i] <= filo[i−1];
        end
        filo[0] <= din;
        mode_cnt <= mode_cnt + 1'b1;
        if(mode_cnt == 2'd3) begin
          mode <= 1'b1;
          mode_cnt <= 2'h0;
        end
      end
      1'b1:begin
        for (i = 3; i > 0; i=i−1) begin
          filo[i−1] <= filo[i];
        end
        filo[3] <= din;
        mode_cnt <= mode_cnt + 1'b1;
        if(mode_cnt == 2'd3) begin
          mode <= 1'b0;
          mode_cnt <= 2'h0;
        end
      end
      endcase
    end else if(!en) begin
      mode_cnt <= 2'h0;
    end
  end
end
assign dout1 = filo[3];
  assign dout2 = filo[0];
  assign dout = (mode == 1'b0) ? dout1 : dout2;
endmodule
```

In Table 1, a start of a module is shown on the 1st line of the list, and various declarations are made on the 2nd to 9th lines. Each packet has 4 data, and a bit width of each data is 2 bits.

Figure 21:
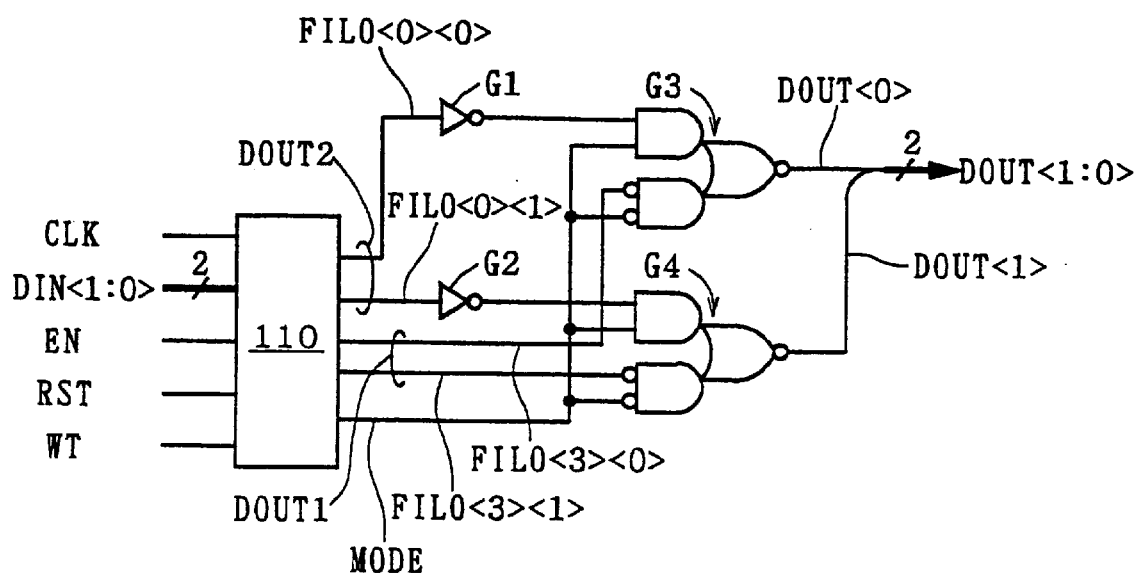
FIG. 21 is a block diagram showing a structure of a bidirectional FILO generated on the basis of list of a Table 1.

FIG. 21 is a block diagram showing a structure of a bidirectional FILO generated on the basis of the list. In the list, variables written in small letters correspond to signals and data written in capital letters in the following drawings.

A logic circuit 110 inputs a clock CLK, 2-bit input data DIN <1:0>, a reset signal RST, a wait signal WT and an enable signal EN, and outputs a mode signal MODE, 2-bit data FILO <0><0> and FILO <0><1> (which form data DOUT2) corresponding to the data stored in the memory M0, and 2-bit data FILO <3><0> and FILO <3><1> (which form data DOUT1) corresponding to the data stored in the memory M3.

Inverters G1 and G2 and composite gates G3 and G4 correspond to the multiplexer MUX so that a pair of FILO <3><0> and FILO<3><1> and a pair of FILO<0><0> and FILO<0><1> are output as 2-bit output data DOUT<1:0> corresponding to the values "0" and "1" of the mode signal MODE, respectively.

Such a structure is defined by assign statements on the 48th to 50th lines of the list, and corresponds to steps S103 to S105 shown in FIG. 5.

The contents shown in the 10th to 47th lines of the list define the logic circuit 110, and FIGS. 22 to 31 are circuit diagrams together showing details of the structure of the logic circuit 110.

An "always" statement on the 10th line of the list indicates that processings on the 11th to 47th lines are performed when the clock CLK rises or the reset signal falls. Description on the 11th line which recognizes that the reset signal RST falls irrespective of the clock CLK is equivalent to step S101 shown in FIG. 5, and steps S113 to S115 (FIG. 6) of performing reset processings are equivalent to the 12th to 14th lines, the 15th line and the 16th line, respectively.

Step S102 shown in FIG. 5 is equivalent to the 18th line of the list. Steps S103 to S112 to be processed when decision of step S102 is "Y" are equivalent to the 19th to 42nd lines. A processing to be performed when the wait signal WT is "1" is not described on the 17th to 46th lines. Therefore, if the wait signal WT is "1", all the processings of steps S103 to S112 are waited for. This corresponds to a processing in which the routine returns to step S101 through step S100 if the decision of step S102 is "N". On the 43rd to 45th lines, it is defined that a 2-bit value "00" is given to the mode control value MODE_CNT if the enable signal EN is "L". This corresponds to step S100.

On the list, the 19th line corresponds to step S103, processings at and after step S106 are defined on the 20th to 30th lines, and processings at and after step S107 are defined on the 31st to 41st lines.

More specifically, if the operation mode is set to a first mode (a mode signal MODE=0), step S106 corresponds to the 21st to 23rd lines, step S108 corresponds to the 24th line, step S110 corresponds to the 26th line, step S111 corresponds to the 27th and 28th lines, and step S112 corresponds to the 25th line. A non-blocking assignment statement is used on the 25th and 28th lines where procedure assignment to the mode control value MODE_CNT is performed. Accordingly, the flowchart shown in FIG. 6 corresponds to the 25th and 28th lines irrespective of order of description on the list.

Similarly, if the operation mode is set to a second mode (the mode signal MODE=1), step S107 corresponds to the 32nd to 34th lines, step S109 corresponds to the 35th line, step S110 corresponds to the 37th line, step S111 corresponds to the 38th and 39th lines, and step S112 corresponds to the 36th line. Also in this operation mode, the non-blocking assignment statement is used on the 36th and 39th lines where the procedure assignment to the mode control value MODE_CNT is performed. Accordingly, the flowchart shown in FIG. 6 corresponds to the 36th and 39th lines irrespective of the order of description on the list.

Figure 22:
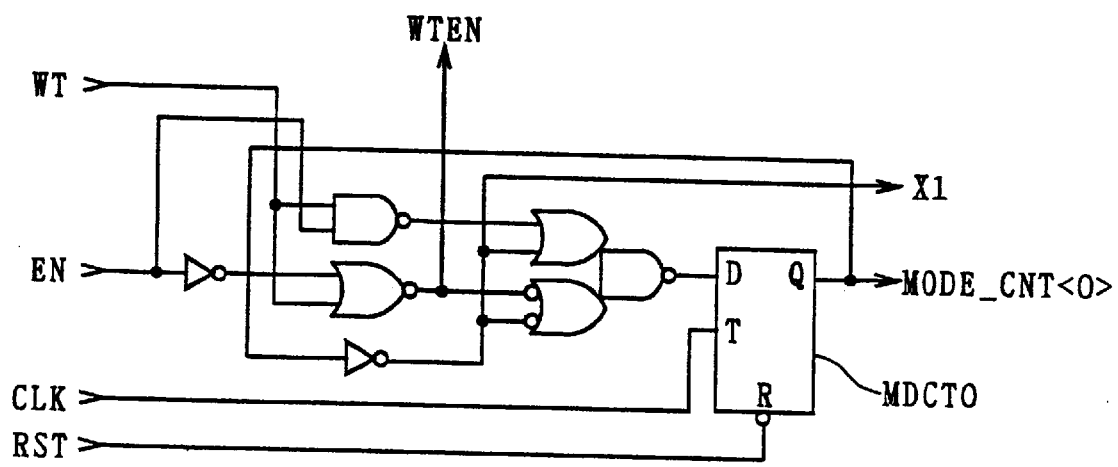
FIGS. 22 to 31 are circuit diagrams together showing details of a structure of a logic circuit 110.

FIG. 22 shows a portion for generating a value MODE_CNT<0> of the 0th bit of the mode control value MODE_CNT and a normal operation signal WTEN. The normal operation signal WTEN is set to "H" only when the wait signal WT is "L" and the enable signal EN is "H", which corresponds to the decision of "Y" at step S102 according to the flowchart and corresponds to execution of the processings described on the 19th to 42nd lines according to the list.

A D flip-flop MDCT0 outputs the mode control value MODE_CNT<0> of the 0th bit. The mode control value MODE_CNT<0> is logically inverted to generate a signal X1. If the normal operation signal WTEN is "H", the signal X1 is sent to a D input terminal of the D flip-flop MDCT0. Therefore, every time a clock CLK is sent to a clock terminal T of the D flip-flop MDCT0, "0" and "1" are alternately output as the mode control value MODE_CNT<0> of the 0th bit. The D flip-flop MDCT0 is also provided with a reset terminal R for performing reset when a reset signal RST falls.

Figure 23:
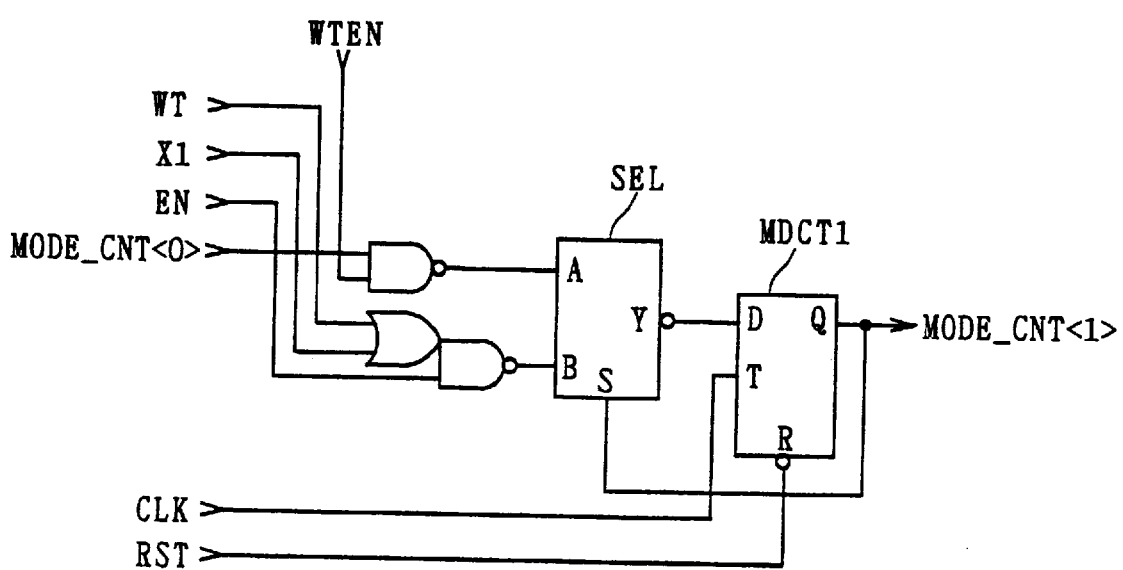

FIG. 23 shows a portion for generating a mode control value MODE_CNT<1> of a 1st bit. A D flip-flop MDCT1 outputs the mode control value MODE_CNT<1> of the 1st bit. In response to the mode control value MODE_CNT<1> of "0" and "1", a selector SEL logically inverts data sent to A and B input terminals, and outputs the logically inverted data to a D input terminal of the D flip-flop MDCT1. If the normal operation signal WTEN is "H", logical inversion of a mode control value MODE_CNT<0> of a 0th bit and logical inversion of a signal X1 (that is, the mode control value MODE_CNT<0> of the 0th bit) are given to the A and B input terminals of the selector SEL, respectively.

As described above, the structures shown in FIGS. 22 and 23 almost correspond to the counter COUNT1 shown in FIG. 7. However, FIGS. 22 and 23 show quarternary counters which do not require feedback of the comparator CMP differently from the counter COUNT1.

Figure 24:
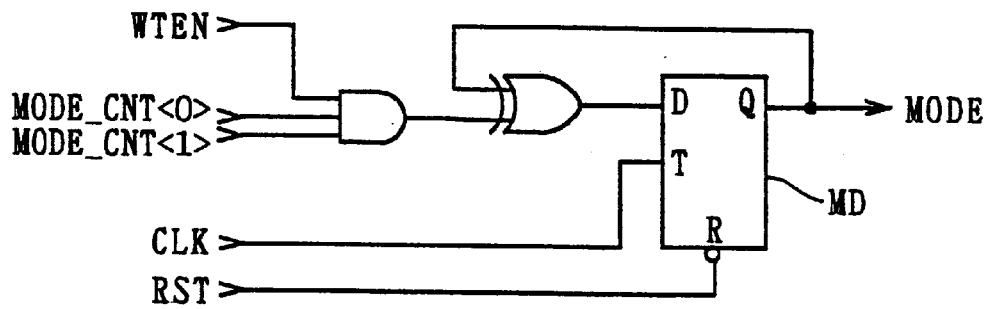

FIG. 24 shows a portion for generating a mode signal MODE. If the normal operation signal WTEN is "H", a logical product of the mode control value MODE_CNT<0> and MODE_CNT<1> is obtained to decide whether or not the mode control value MODE_CNT is coincident with a value "3" in a decimal number (this processing is equivalent to a processing of step S110). In order to perform a processing of step S111, furthermore, an exclusive-OR operation between the logical product of the mode control values MODE_CNT<0> and <1> and the mode signal MODE is conducted to a D input terminal of a D flip-flop MD. The D flip-flop MD outputs the mode signal MODE.

Figure 25:
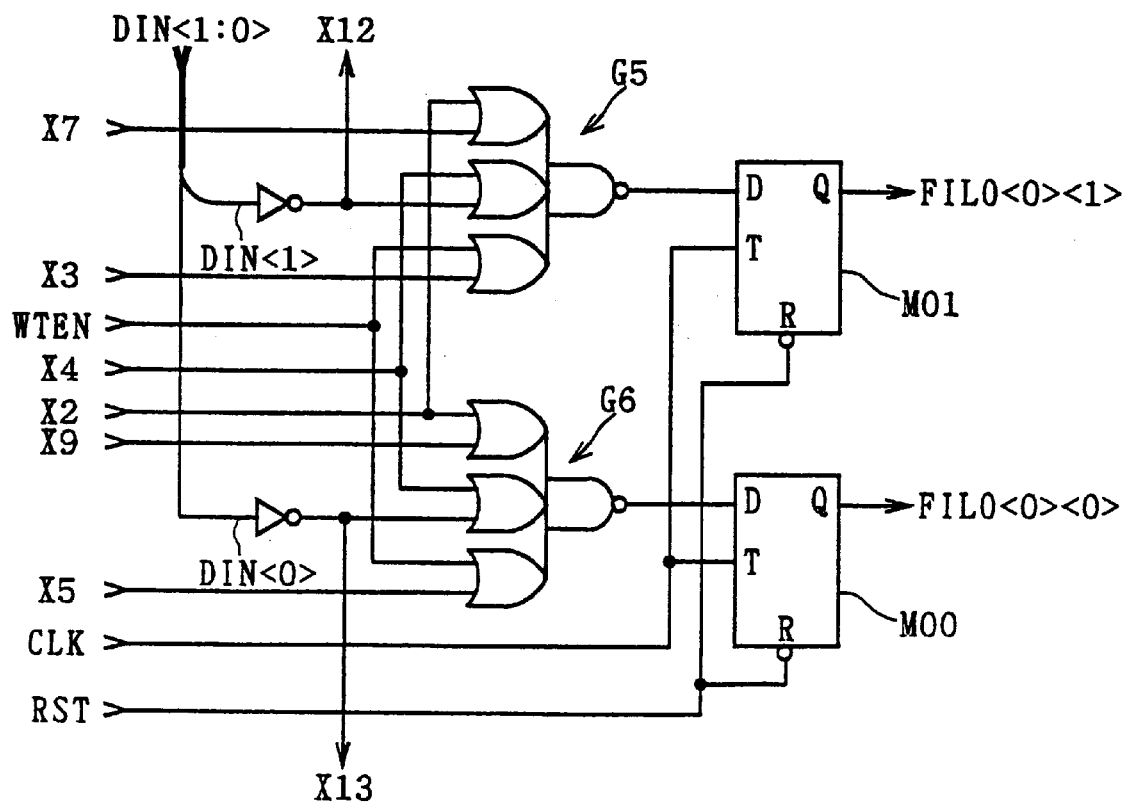

FIG. 25 shows a structure including D flip-flops M00 and M01 corresponding to 0th and 1st bits of the memory M0. Outputs of composite gates G5 and G6 are given to respective D input terminals. Respective outputs FILO <0><0> and FILO <0><1> of the D flip-flops M00 and M01 are equivalent to 2-bit information stored in the memory M0.

2-bit input data DIN <0> and DIN <1> are logically inverted and input to the composite gates G6 and G5, respectively. The reason why the input data DIN <0> and DIN <1> are logically inverted is that final output stages of the composite gates G5 and G6 are NAND gates.

Figure 26:
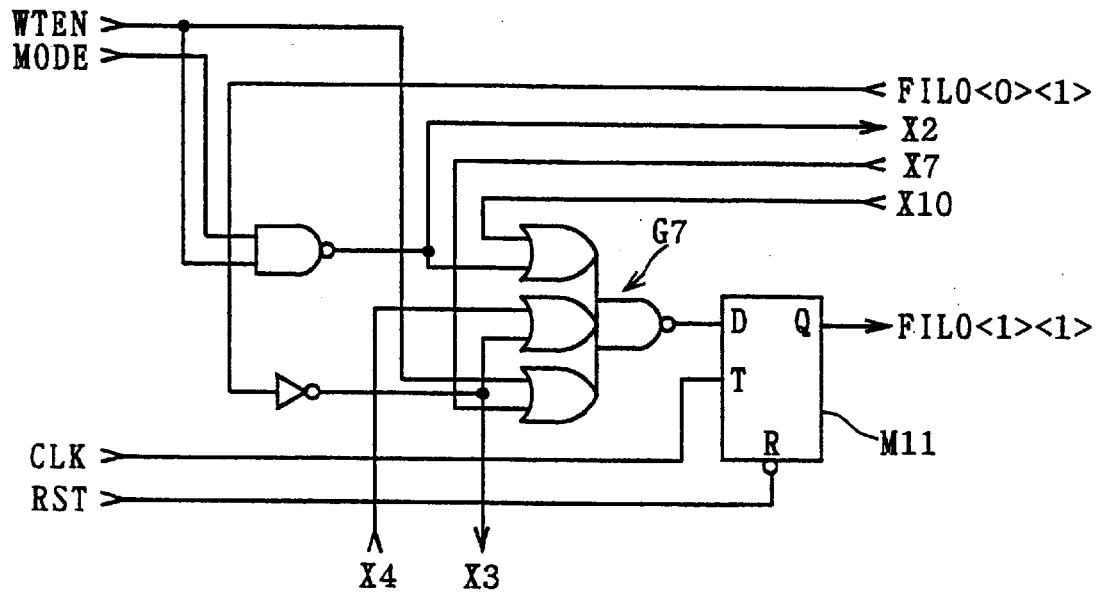
Figure 27:
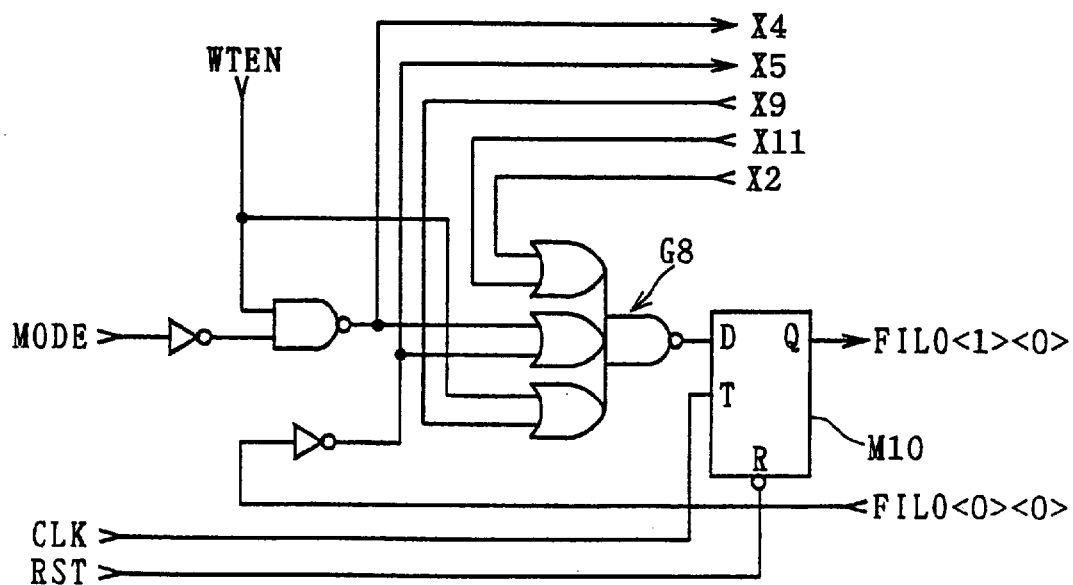

FIG. 26 shows a structure including a D flip-flop M11 corresponding to a 1st bit of the memory M1, and FIG. 27 shows a structure including a D flip-flop M10 corresponding to a 0th bit of the memory M1. Outputs of composite gates G7 and G8 are given to respective D input terminals of the D flip-flops M11 and M10. Respective outputs FILO <1><0> and FILO <1><1> of the D flip-flops M10 and M11 are equivalent to 2-bit information stored in the memory M1.

Figure 28:
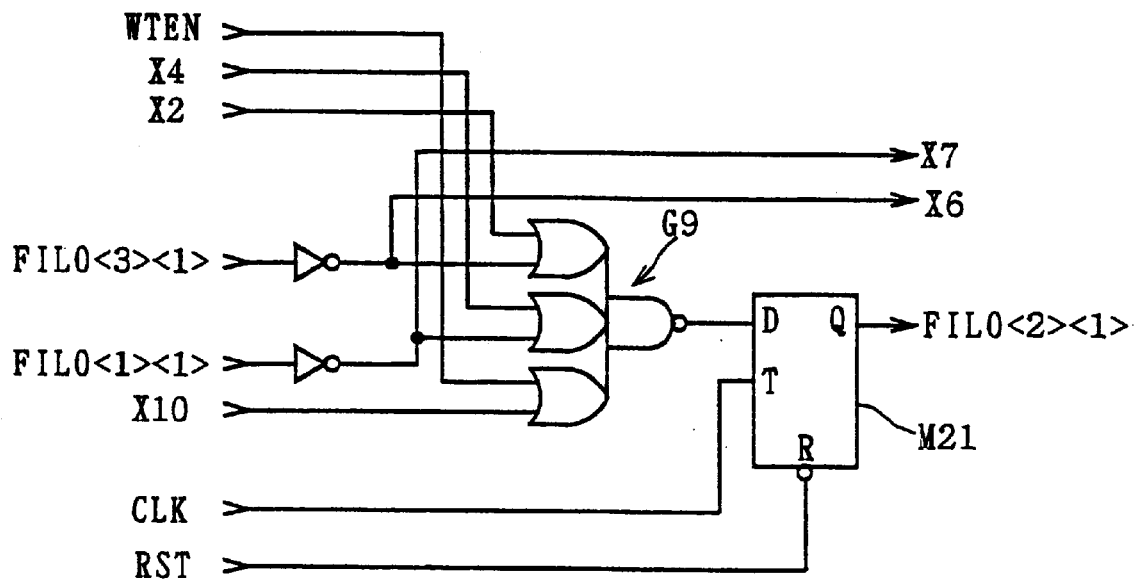
Figure 29:
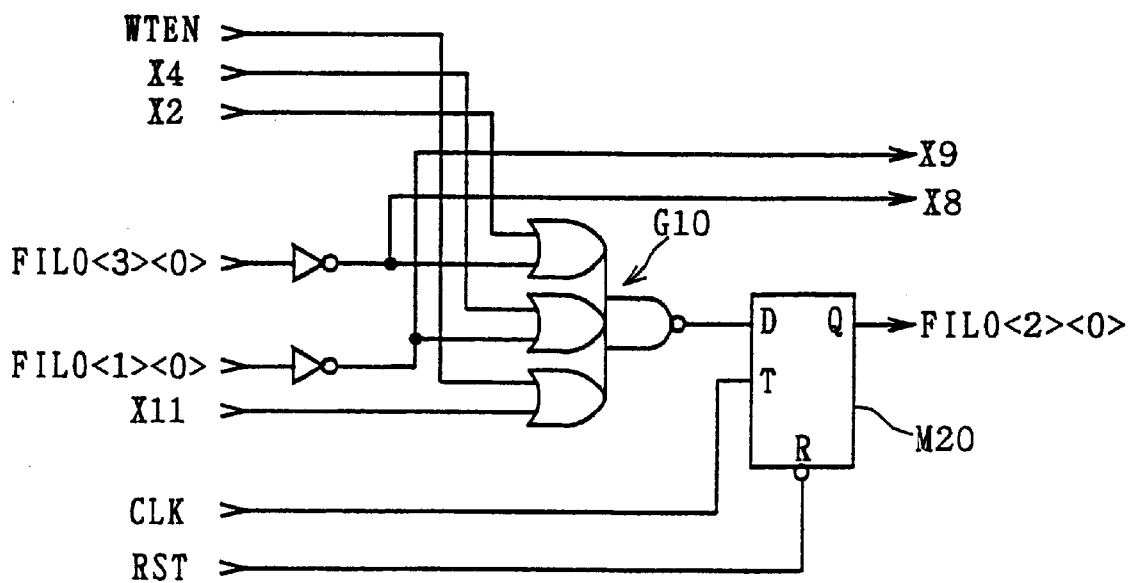

FIG. 28 shows a structure including a D flip-flop M21 corresponding to a 1st bit of the memory M2, and FIG. 29 shows a structure including a D flip-flop M20 corresponding to a 0th bit of the memory M2. Outputs of composite gates G9 and G10 are given to respective D input terminals of the D flip-flops M21 and M20. Respective outputs FILO <2><0> and FILO <2><1> of the D flip-flops M20 and M21 are equivalent to 2-bit information stored in the memory M2.

Figure 30:
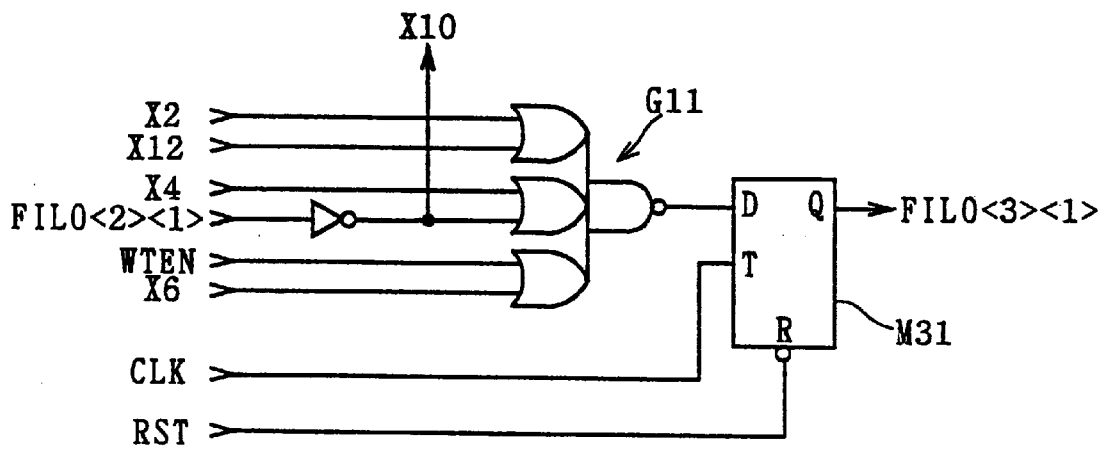
Figure 31:
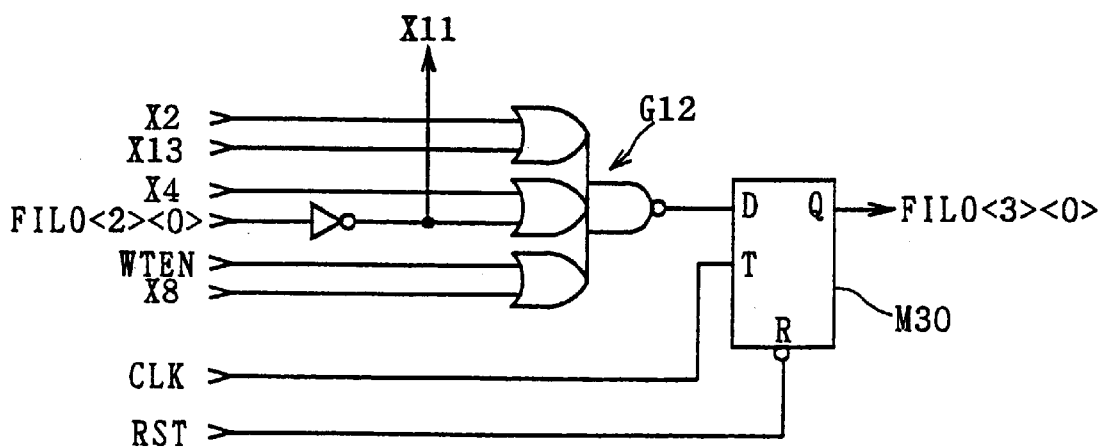

FIG. 30 shows a structure including a D flip-flop M31 corresponding to a 1st bit of the memory M3, and FIG. 31 shows a structure including a D flip-flop M30 corresponding to a 0th bit of the memory M3. Outputs of composite gates G11 and G12 are given to respective D input terminals of the D flip-flops M31 and M30. Respective outputs FILO <3><0> and FILO <3><1> of the D flip-flops M30 and M31 are equivalent to 2-bit information stored in the memory M3. Signals X13 and X12 are obtained by logically inverting the input data DIN <0> and DIN <1>, and are input to the composite gates G12 and G11, respectively.

The composite gates G5 to G12 implement the function of integrating the control sections CNT1 to CNT3 and the demultiplexer DMUX shown in FIG. 7 together with an inverter (including a NAND gate functioning as the inverter when the normal operation signal WTEN is set to "H").

In the drawings, if the normal operation signal WTEN is "H", signals X2 and X4 have the same logic as that of the mode signal MODE, respectively. Irrespective of the value of the normal operation signal WTEN, signals X5, X3, X9, X7, X11, X10, X8 and X6 are obtained by logically inverting FILO <0><0>, FILO <0><1>, FILO <1><0>, FILO <1><1>, FILO <2><0>, FILO <2><1>, FILO <3><0> and FILO <3><1>, respectively.

In the case where the wait signal WT is set to "H" to give a wait instruction, the normal operation signal WTEN is set to "L" so that none of the contents of the D flip-flop is changed by operation of the composite gates G5 to G12. Also in the case where the enable signal EN is set to "L" and is not brought into the enable state, the normal operation signal WTEN is set to "L" so that "0" is given to the D input terminals of the D flip-flops MDCT0 and MDCT1 to execute step S100. Furthermore, in the case where the reset signal RST falls to receive a reset instruction, the processings of steps S113 to S115 are performed.

Figure 32:
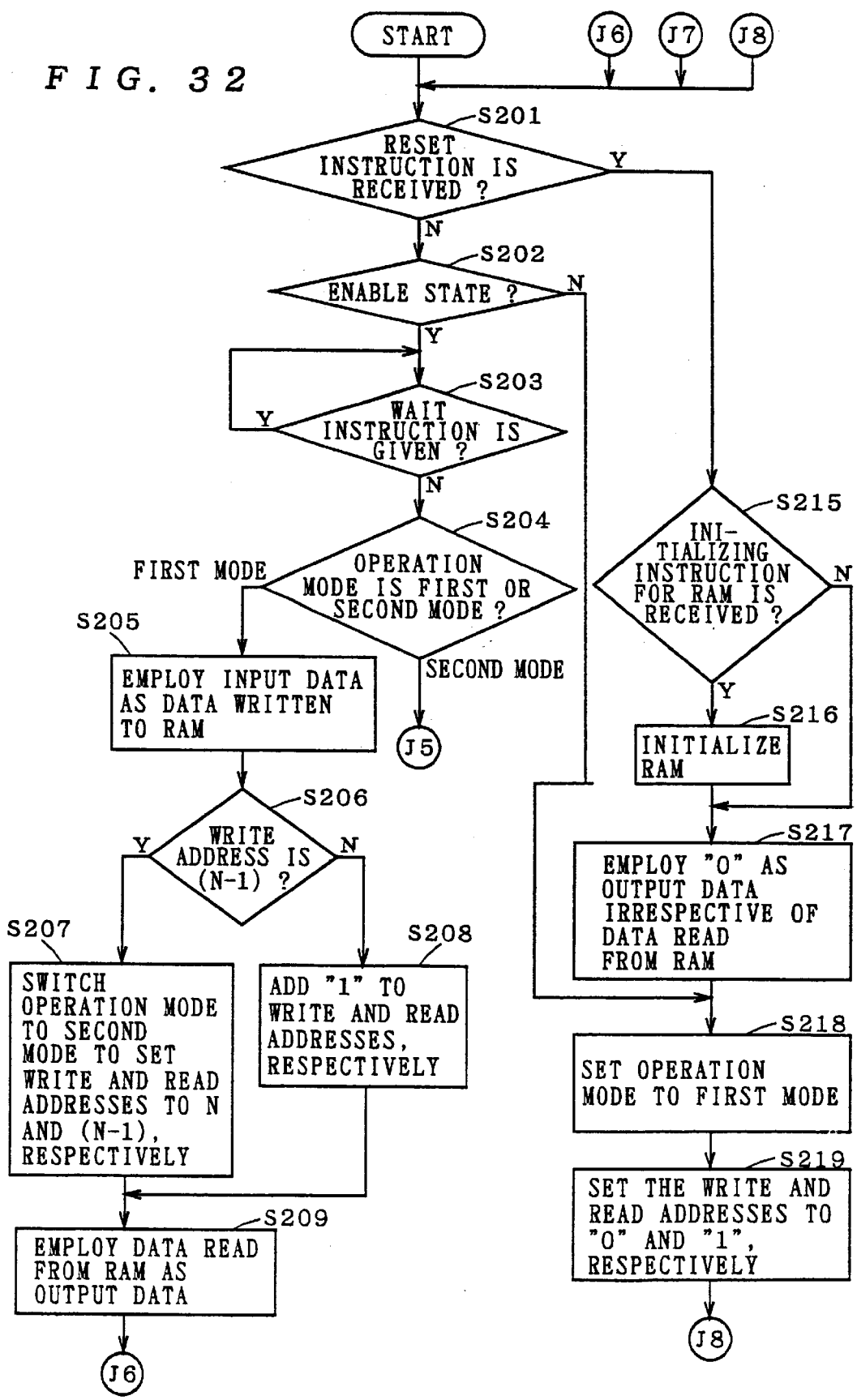
FIGS. 32 and 33 are flowcharts together showing operation of an address pointer type bidirectional FILO.
Figure 33:
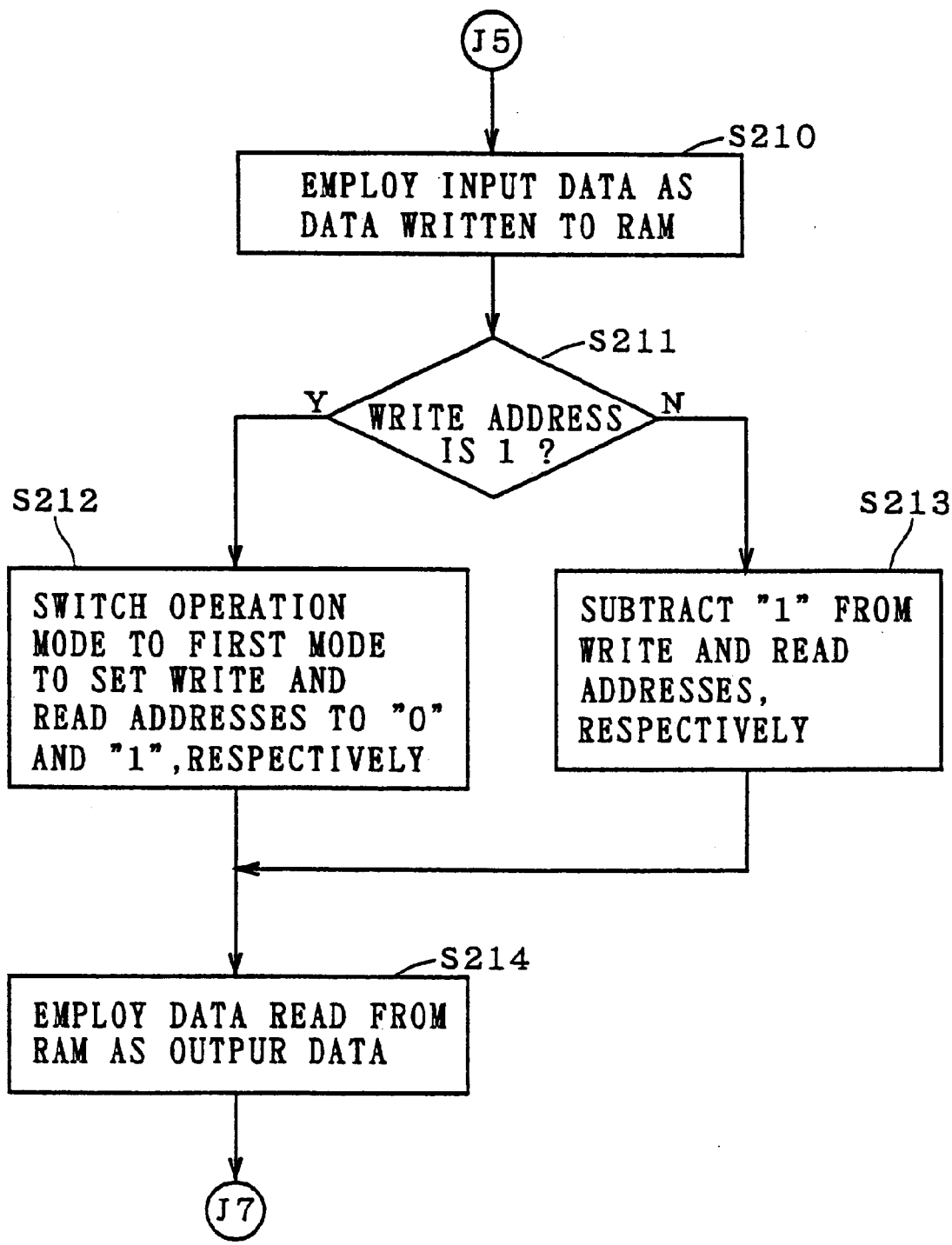
Figure 34:
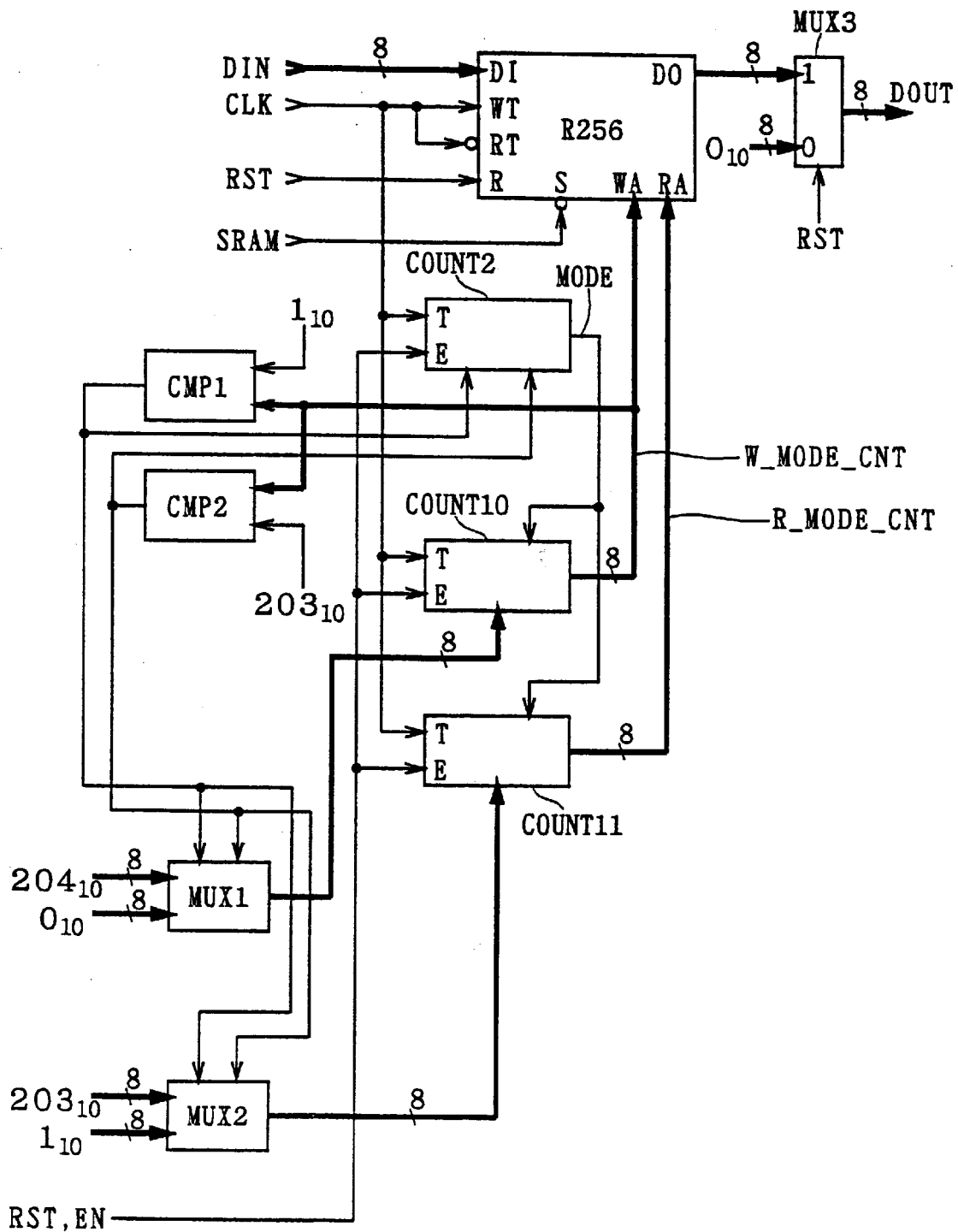
FIG. 34 is a block diagram illustrating a structure of the address pointer type bidirectional FILO.

(d-2) Address Pointer Type Bidirectional FILO;

FIGS. 32 and 33 are flowcharts together showing operation of an address pointer type bidirectional FILO. FIGS. 32 and 33 are connected to each other by connectors J5 and J7. FIG. 34 is a block diagram illustrating a structure of the address pointer type bidirectional FILO. FIGS. 35 to 47 are typical diagrams showing, in order, operation of the bidirectional FILO in FIG. 34.

The bidirectional FILO shown in FIG. 34 comprises a memory R256 acting as a RAM, multiplexers MUX1 and MUX2, counters COUNT10, COUNT11 and COUNT2, and comparators CMP1 and CMP2.

The counters COUNT10 and COUNT11 are controlled such that counting directions are set to "increase" or "decrease" depending on whether a mode signal MODE generated by the counter COUNT2 has a value "0" or "1", and generate 8-bit mode control values W_MODE_CNT and R_MODE_CNT. The mode control values W_MODE_CNT and R_MODE_CNT act as write and read addresses for the memory R256, respectively.

Each of the counters COUNT10, COUNT11 and COUNT12 has a clock terminal T for receiving a clock CLK. The counters COUNT10 and COUNT11 count rise of the clock CLK. On the other hand, the counter COUNT2 is a 1-bit counter which does not count the clock CLK but counts outputs of the comparators CMP1 and CMP2 in the same manner as in the shift register type bidirectional FILO. A timing in which the value of the mode signal MODE output from the counter COUNT2 is changed synchronous with the clock CLK. A reset signal RST or an enable signal EN is sent to enable terminals E of the counters COUNT10, COUNT11 and COUNT12 to control operation.

Initial values of the counters COUNT10 and COUNT11 are obtained from outputs of the multiplexers MUX1 and MUX2, respectively. The multiplexer MUX1 inputs 8-bit signals having values of 0 and 204 in decimal numbers, and the multiplexer MUX2 inputs 8-bit signals having values of 203 and 1 in decimal numbers. Either of the two inputs received by each of the multiplexers MUX1 and MUX 2 is output depending on the outputs of the comparators CMP1 and CMP2.

A value of 1 in a decimal number and a mode control value W_MODE_CNT are given to the comparator CMP1. If both values are equal to each other, the multiplexers MUX1 and MUX2 are controlled to output "0" and "1", respectively. A value of 203 in a decimal number and the mode control value W_MODE_CNT are given to the comparator CMP2. If both values are equal to each other, the multiplexers MUX1 and MUX2 are controlled to output "204" and "203", respectively.

The clock CLK is sent to a write clock terminal WT and a read clock terminal RT of the memory R256 in common to write and read data to and from the memory R256 synchronized with rise and fall of the clock CLK, respectively.

Input data DIN is given to a write terminal DI so that data of the memory R256 is read from a read terminal DO. In FIG. 34, a multiplexer MUX3 is further provided. When a reset signal RST is deactivated ("1"), the data read from the memory R256 is employed as output data DOUT of the bidirectional FILO. When the reset signal RST is activated ("0"), the value "0" in a decimal number is employed as the output data DOUT of the bidirectional FILO. The reason will be described below.

FIGS. 35 to 47 show storage units #0 to #N corresponding to (N+1) addresses 0 to N. The memory R256 has 256 storage units, and N=204 is set. As a matter of course, other values can be used if N is less than 256. In that case, values given to the multiplexers MUX1 and MUX2 are N and (N-1) in place of 204 and 203, respectively.

In a flowchart shown in FIG. 32, steps S201 to S204 are executed irrespective of the clock CLK. At step S201, it is decided whether a reset instruction is received or not (whether the reset signal RST is activated or deactivated). If the reset instruction is received, reset processings of steps S215 to S219 are executed and the routine returns to step S201 through a connector J8. If the reset instruction is not received, it is decided whether the enable state is set or not at step S202 (whether the enable signal EN is activated or deactivated). If the enable state is not set, the processings of steps S218 and S219 are executed and the routine returns to step S201. At step S203, it is decided whether a wait instruction is given or not (whether a wait signal WT is activated or deactivated). If the wait instruction is not given, the routine proceeds to step S204.

The reset processing will be described below. At step S215, it is decided whether or not an initializing instruction for the memory R256 acting as the RAM is received. If the initializing instruction is received, the RAM is initialized. If an initializing signal SRAM sent to an initializing terminal S of the memory R256 is activated ("0"), a specific value, for example, "0" is given to all addresses of the memory R256 synchronized with rise of the clock CLK. More specific description will be given later. At this time, the read data output from the memory R256 does not make sense as the output data DOUT. Therefore, a specific value (which is set to "0" in FIG. 34 and coincident with a value used for initialization by chance) is separately employed as the output data DOUT by the multiplexer MUX3 (step S217).

At step S218, an operation mode is initialized to a first mode. At step S219, a write address and a read address are initialized to "0" and "1", respectively. The initial values of the counters COUNT10 and COUNT11 are set to "0" and "1" by activation of the reset signal RST or deactivation of the enable signal EN, respectively. Also in the cases where the reset instruction is given and where the enable state is not set, the processings of steps S218 and S219 are executed. As far as the write and read addresses are concerned, the processings of steps S218 and S219 are identical. Therefore, the reset signal RST and the enable signal EN are used for the signal to the enable terminals E of the counters COUNT2, COUNT10 and COUNT11 in common.

Figure 35:
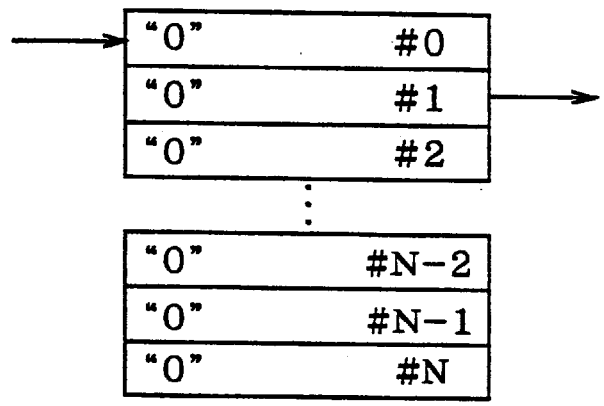
FIGS. 35 to 47 are typical diagrams showing, in order, operation of the bidirectional FILO illustrated in FIG. 34.

FIG. 35 shows the state of the storage units #0 to #N obtained immediately after reset is performed. "0" is stored in all the storage units #0 to #N.

At step S204, it is decided whether the operation mode is a first mode or a second mode. In response to respective cases, the routine branches into step S205 or step S210 through the connector J5.

The first mode is equivalent to the case where the mode signal MODE is "0". At step S205, the input data DIN is employed as the write data to the RAM. Write operation is performed synchronously with the rise of the clock CLK.

At step S206, it is decided whether the write address is (N−1) or not. This processing is executed by the comparator CMP2 for inputting the mode control value W_MODE_CNT and 203 (=204−1). As long as the write address is not (N−1), both the write address and the read address are increased by 1 at step S208. This processing is executed by the counters COUNT10 and COUNT11. While the processing of step S208 is also executed in response to the rise of the clock CLK, it is performed after step S205.

Figure 36:
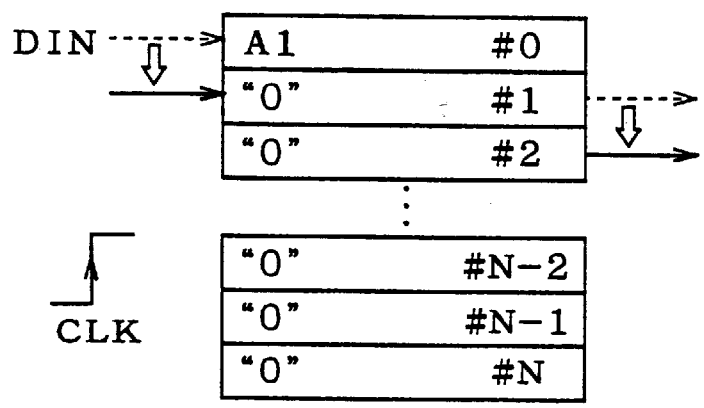

FIG. 36 shows processings for the storage units #0 to #N to be executed when the clock CLK first rises after the reset processing is performed. Since the write address has been set to "0" at step S219, a value A1 of the input data DIN is first stored in the storage unit #0 in accordance with step S205. Then, the read and write addresses are increased by 1 in accordance with step S208 respectively so that values "1" and "2" are taken. A broken line in FIG. 36 indicates write operation of step S205, and a white arrow indicates operation of step S208 in which the address is changed in response to the rise of the clock CLK.

Figure 37:
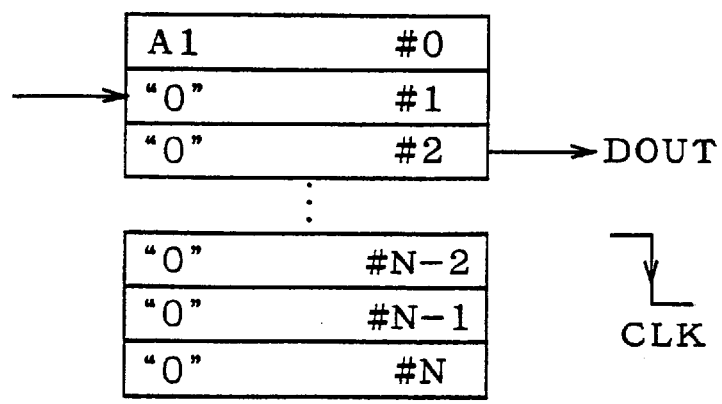

At step S209, the read data of the RAM is employed as output data synchronously with the fall of the clock CLK. Since the read address is set to "2" at step S208, the value of "0" obtained after reset which has been stored in the storage unit #2 is read. FIG. 37 shows this state. Although the write address has the value of "1", the write operation is not performed in response to the fall of the clock CLK. At this time, consequently, the value stored in the storage unit #1 is not changed.

Figure 38:
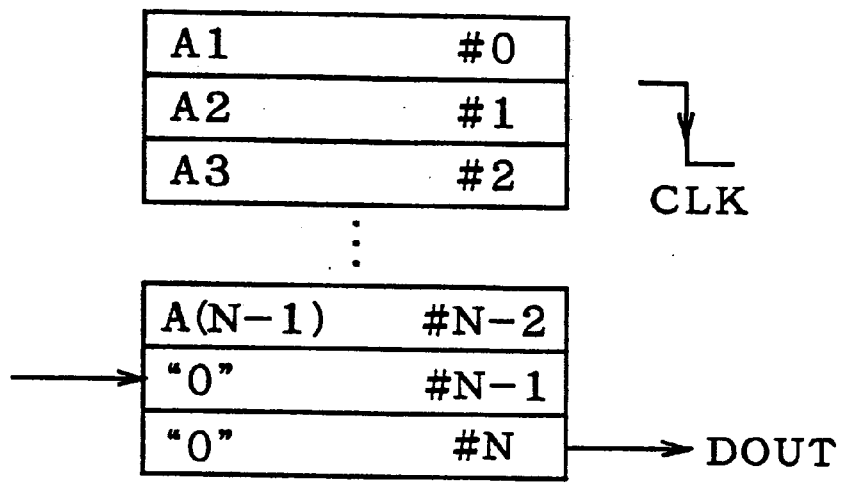

It is assumed that steps S206, S208 and S209 are repeated through steps S201 to S205 and the write and read addresses are set to (N−1) and N at step S208, respectively. (N−1) values A1 to A(N−1) have sequentially been stored in the storage units #0 to #(N−1) at step S205. FIG. 38 shows operation obtained when step S209 is executed in this state. At this time, the clock CLK has fallen just before, and new input data DIN has not been stored in the address #(N−1). On the other hand, the output data DOUT outputs the value of "0" obtained after reset.

Figure 39:
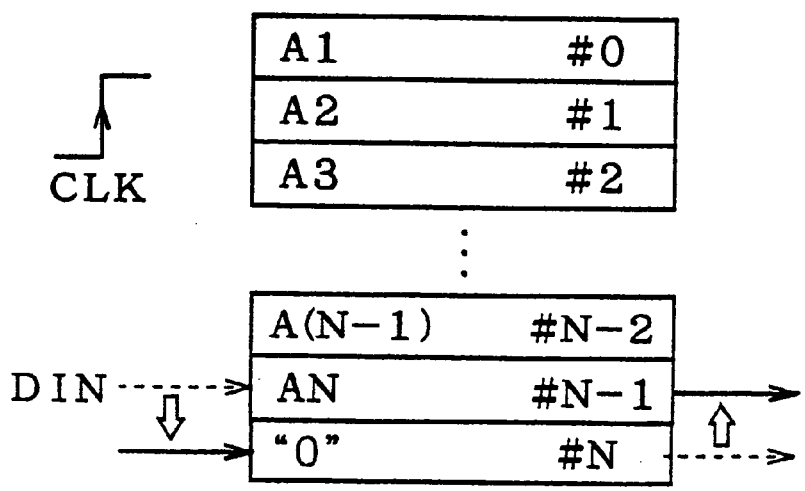

Then, step S205 is executed through a connector J6 and steps S201 to S204, and a value AN is written to the storage unit #(N−1). This state is shown by a broken line in FIG. 39. Since the write address is (N−1), the routine proceeds from step S206 to step S207 where the operation mode is changed to the second mode and the write and read addresses are set to N and (N−1), respectively. A solid line and a white arrow in FIG. 39 show this address modification.

Such address setting corresponds to a fact that the comparator CMP2 shown in FIG. 34 causes the multiplexers MUX1 and MUX2 to output 204 and 203, respectively. Consequently, the initial values of the counters COUNT10 and COUNT11 are reset.

In the same manner as step S208, step S207 is also executed after step S205 in response to the rise of the clock CLK. As shown in FIG. 39, the N data A1 to AN have sequentially been stored in the storage units #0 to #(N−1).

Figure 40:
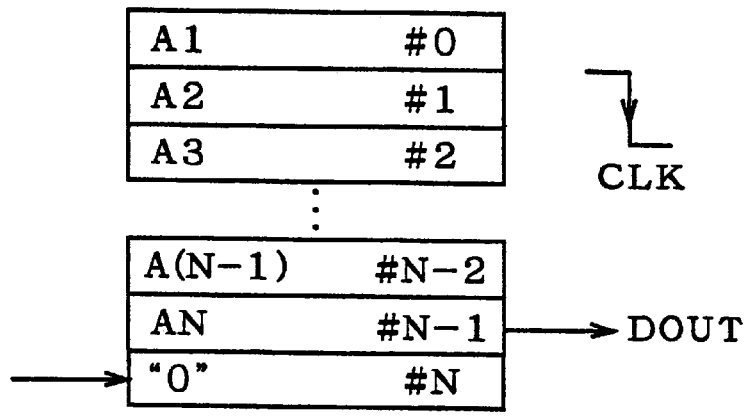
Figure 41:
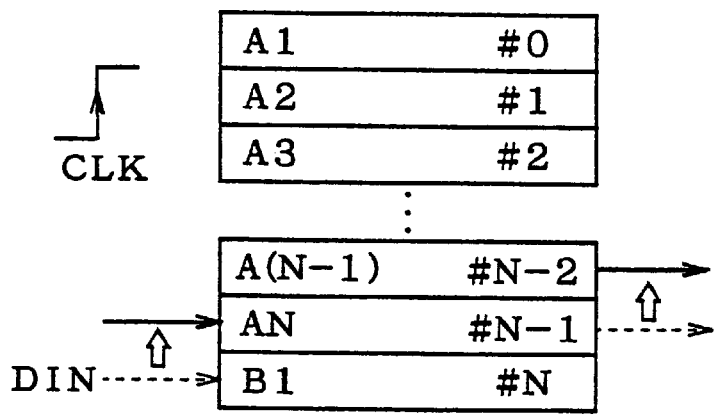

At step S209, the value stored in the storage unit #(N−1) is read. Accordingly, the value AN obtained as a first value after "0" is continuously obtained as the output data DOUT (FIG. 40).

Furthermore, when the routine reaches step S204 through the connector J6 and steps S201 to S203, the operation mode is changed to the second operation mode. Therefore, step S210 is executed. Since the write address is not changed before step S210 is reached, a value B1 of the input data DIN is written to the storage unit #N. This state is shown by a broken line in FIG. 41.

Then, the routine proceeds to step S211 where it is decided whether the write address is 1 or not. This processing is performed by the comparator CMP1 for inputting the mode control value W_MODE_CNT and "1". As long as the write address is not 1, the write and read addresses are decreased by 1 at step S213. This processing is performed by the counters COUNT10 and COUNT11. Step S211 is also executed in response to the rise of the clock CLK after step S21. Since the write address is N at step S211, the write and read addresses are set to (N−1) and (N−2) at step S213, respectively (see a white arrow and a solid line in FIG. 41).

Figure 42:
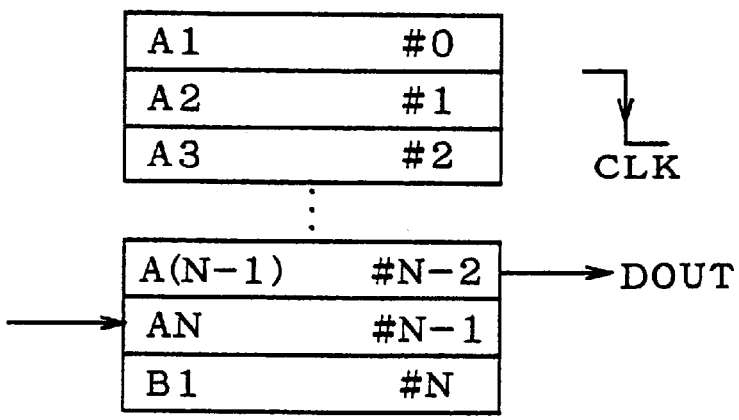

Then, the routine proceeds to step S214 where the output data DOUT is obtained in the same manner as step S209. FIG. 42 shows the state in which a value A(N−1) is read from the storage unit #(N−2) synchronously with the fall of the clock CLK.

Thus, steps S210 to S213 and S214 are repeated through the connector J7 and steps S201 and S204, and the output data DOUT sequentially outputs the values AN, A(N−1), . . .

Figure 43:
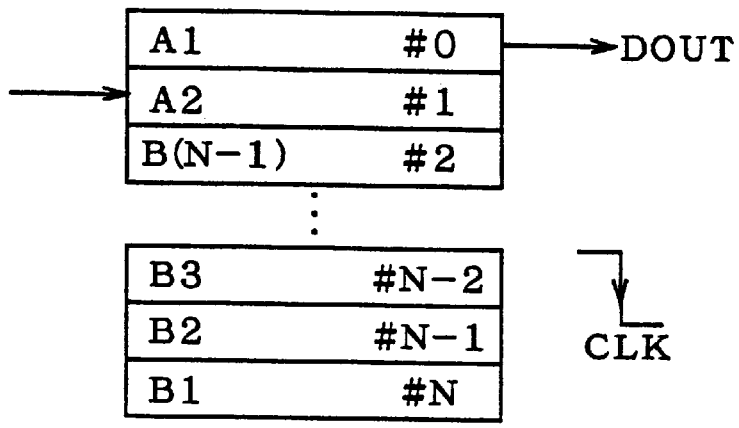

It is assumed that the write and read addresses are set to 1 and 0 respectively at step S213. When the clock CLK then falls and step S214 is executed, the value A1 is obtained as the output data DOUT as shown in FIG. 43. The value stored in the storage unit #1, however, is still set to A2 and is not updated.

Figure 44:
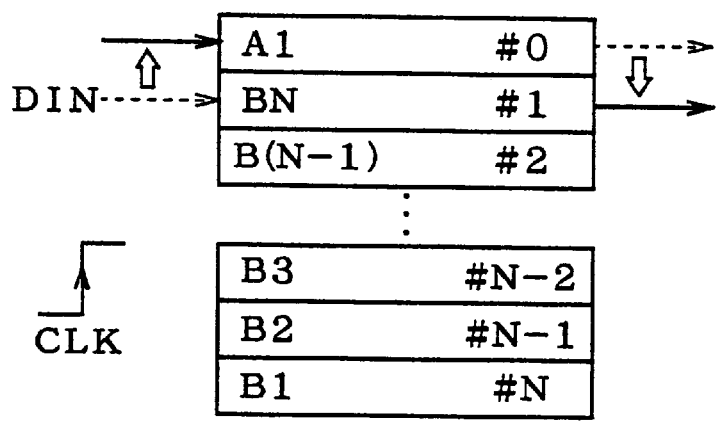

Then, step S210 is executed through the connector J7 and steps S201 to S204, and the value BN is written to the storage unit #1 (see a broken line in FIG. 44). Since the write address is 1, the routine proceeds from step S211 to step S212 where the operation mode is changed to the first mode and the write and read addresses are set to 0 and 1 respectively (see a white arrow and a solid line in FIG. 44). Such address setting corresponds to a fact that the comparator CMP1 shown in FIG. 34 causes the multiplexers MUX1 and MUX2 to output 0 and 1, respectively. Consequently, the initial values of the counters COUNT10 and COUNT11 are reset.

In the same manner as step S213, step S212 is also executed after step S210 in response to the rise of the clock CLK. FIG. 44 shows the state of the storage units #0 to #N obtained at this time. N data B1 to BN have sequentially been stored in the storage units #N to #1.

Figure 45:
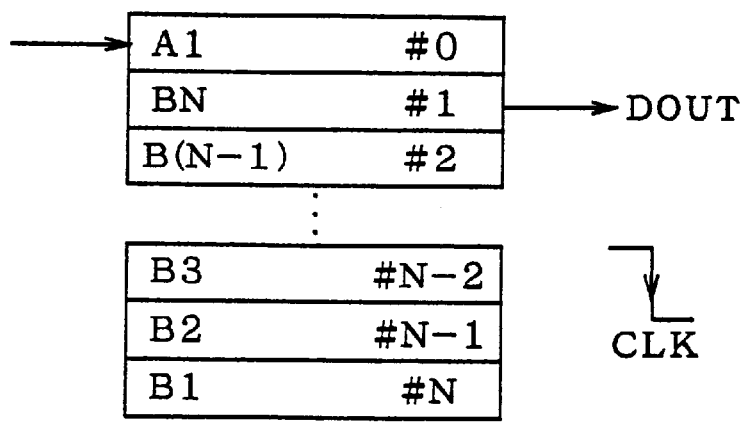

Then, the values stored in the storage unit #1 are read at step S214. Accordingly, the value BN is obtained as the output data DOUT after the values AN, A(N−1), . . . , A1 (FIG. 45).

Furthermore, when the routine proceeds to step S204 through the connector J7 and steps S201 to S203, the operation mode is changed to the first operation mode. Consequently, step S205 is executed. The write address is not changed before step S205 is reached. Therefore, a value C1 of the input data DIN is written to the storage unit #0. This state is shown by a broken line in FIG. 46.

Figure 46:
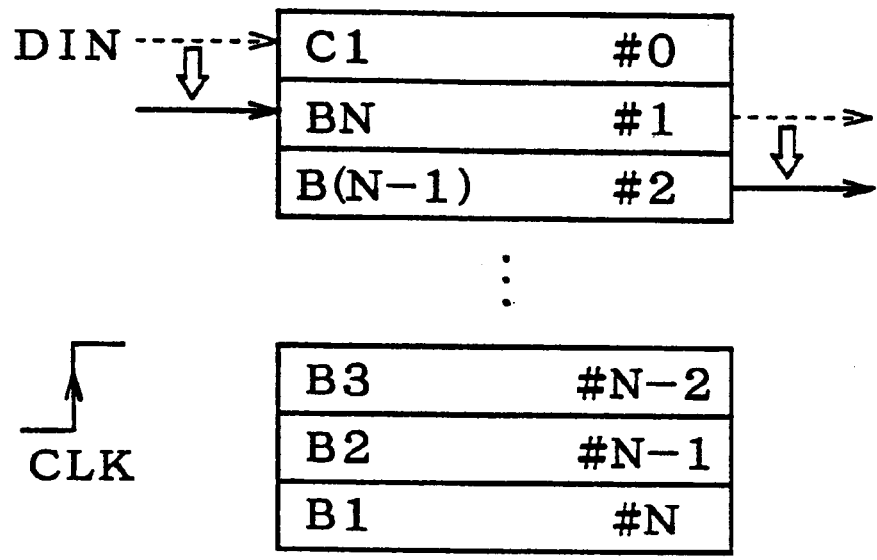
Figure 47:
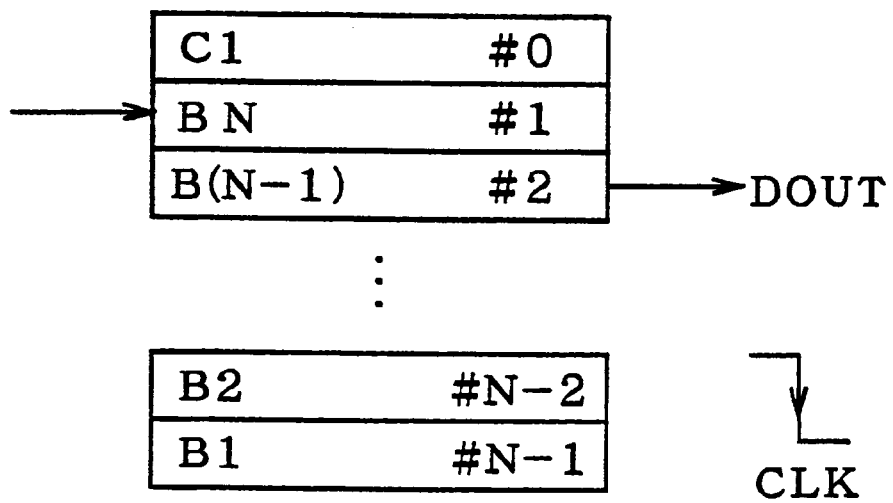

Then, the routine proceeds from step S206 to step S208 where the write and read addresses are set to 1 and 2, respectively. A white arrow in FIG. 46 shows operation of step S208.

If a set of N (204 in FIG. 34) values (A1, A2, . . . , AN), (B1, B2, . . . , BN), . . . are sequentially input as the input data DIN by using (N+1) memory elements as described above, (AN, . . . , A2, A1), (BN, . . . , B2, B1), . . . are obtained as the output data DOUT. More specifically, the function of the FILO can continuously be displayed for plural sets of N data by using the RAM having at least (N+1) addresses.

The reason is that the input data is written following the reading of the contents stored in the storage units, and directions of movement of the read and write addresses are changed to those from top to bottom and from bottom to top corresponding to update of the set of input data.

As described above, the address pointer type bidirectional FILO can be implemented by utilizing the conventional RAM.

While the mode control value W_MODE_CNT and R_MODE_CNT have been shifted by 1 in the address pointer type bidirectional FILO, it is apparent that they can be shifted by K (an integer equal to or more than 0). In that case, the necessary memory elements are (N+K). At step S207, the write address is set to (N+K−1). At step S211, it is decided whether the write address is K or not. At steps S212 and S219, the read address is set to K. Even if K=0, write and read are performed in response to the rise and fall of the clock CLK, respectively. Therefore, the above-mentioned effects can be obtained.

Table 2 shows a list of a hardware descriptive language (HDL) which describes the address pointer type bidirectional FILO. In the same manner as in Table 1, the Verilog-HDL made by Cadence Co., Ltd. has been used. N=204 and K=1 are set.

TABLE 2

```
module bifilo1(clk, rst, en, wt, din, dout, sram);
    input          clk, rst, en, wt, sram;
    input   [7:0]  din;
    output  [7:0]  dout;
    wire    [7:0]  dout1, dout2, dout3, memo;
    reg     [7:0]  filo[0:203];
    reg            mode;
    reg     [7:0]  w_mode_cnt, r_mode_cnt;
    reg     [7:0]  dout;
    integer i;
always @(posedge clk) begin
    if(!rst) begin
        mode <= 1'b0;
        w_mode_cnt <= 8'h0;
        r_mode_cnt <= 8'h1;
    end else begin
        if(!wt αα en) begin
            case(mode)
            1!b0:begin
                w_mode_cnt <= w_mode_cnt + 1'b1;
                r_mode_cnt <= r_mode_cnt + 1'b1;
                if(w_mode_cnt == 8'd203) begin
                    mode <= 1'b1;
                    w_mode_cnt <= 8'd204;
                    r_mode_cnt <= 8'd203;
                end
            end
```

TABLE 2-continued

```
            1'b1:begin
                w_mode_cnt <= w_mode_cnt - 1'b1;
                r_mode_cnt <= r_mode_cnt - 1'b1;
                if(w_mode_cnt == 8'd1) begin
                    mode <= 1'b0;
                    w_mode_cnt <= 8'h0;
                    r_mode_cnt <= 8'd1;
                end
            end
            endcase
        end else if(!en) begin
            w_mode_cnt <= 8'h0;
            r_mode_cnt <= 8'h1;
            mode <= 1'b0;
        end
    end
end
always @(posedge clk) begin
    if(!rst) begin
        dout <= 8'h0;
    end else begin
        if(!wt) begin
            dout <= memo;
        end
    end
end
RAM256 mem256 (.T0(clk), .T1(clk), .A0(w_mode_cnt),
    .A1(r_mode_cnt), .DI0(din), .D01(memo), .rst(rst),
    .sram(sram));
endmodule
    module RAM256 (T0, T1, A0, A1, DI0, D01, rst, sram);
        input       T0;      // WRITE CLOCK
        input       T1;      // READ CLOCK
        input[7:0]  A0;      // WRITE ADDRESS
        input[7:0]  A1;      // READ ADDRESS
        input[7:0]  DI0;     // WRITE DATA
        input       rst, sram;
        output[7:0] D01;     // READ DATA
        reg[7:0]    WP, RP;
    always @(posedge T0) begin
        if(!rst αα sram) begin
            {WP,RP} <= 16'h0;
        end else if(!sram) begin
            RP <= 8'h0;
            if(WP == 8'd255) begin
                WP <= 8'h0;
            end else begin
                WP <= WP+1'b1;
            end
        end
    end
wire[7:0] RPRAM = (sram == 1'b0) ? RP : A1;
wire[7:0] WPRAM = (sram == 1'b0) ? WP : A0;
    RAM256C r256(T0, T1, WPRAM, RPRAM, DI0, D01);
endmodule
    module RAM256C(T0, T1, A0, A1, DI0, D01);
        input       T0;      // WRITE CLOCK
        input       T1;      // READ CLOCK
        input[7:0]  A0;      // WRITE ADDRESS
        input[7:0]  A1;      // READ ADDRESS
        input[7:0]  DI0;     // WRITE DATA
        output[7:0] D01;     // READ DATA
        reg[7:0]    D01;
        reg[7:0]    MEMORY[255:0];
    always @(negedge T1)
        D01 <= MEMORY[A1];
    always @(posedge T0)
        MEMORY[A0] <= DI0[7:0];
endmodule
```

The 1st to 56th lines of the list describe "module bifilol", the 57th to 81st lines of the list describe "module RAM256", and the 82nd to 95th lines of the list describe "module RAM256C".

A start of a module is shown on the 1st line of the list, and various declarations are made on the 2nd to 10th lines. A start of the module is shown on the 57th line of the list, and various declarations are made on the 58th to 65th lines. A start of the module is shown on the 82nd line of the list, and various declarations are made on the 83rd to 90th lines.

The "module RAM256C" defines a core section of the RAM (including a portion corresponding to the storage unit shown in FIGS. 35 to 47) in which write and read are performed in response to the rise and fall of the clock CLK, respectively. The 66th to 79th lines define a part of a reset processing and an initialization processing.

Steps S215 and S216 to be executed through step S201 are equivalent to processings of an "if-else" statement shown on the 69th to 76th lines of the list, and to the 78th to 80th lines of the list for performing initialization through read and write addresses specified by variables RP and WP, respectively.

Referring to the reset processing, furthermore, step S217 is equivalent to the 47th line of the list, and steps S218 and S219 to be executed through step S201 are equivalent to the 12th to 15th lines of the list.

Steps S218 and S219 to be executed through step S202 are equivalent to the 38th to 41st lines of the list. If decision is "Y" at step S203, the output data is not updated corresponding to the 49th to 51st lines of the list. If the decision is "N" at step S203, processings defined by "case" statements on the 18th to 37th lines of the list are performed.

Referring to "case" statements on the 18th to 37th lines of the list, the 18th line of the list is equivalent to step S204, the 19th to 27th lines of the list are equivalent to steps S206 to S208, and the 28th to 36th lines of the list are equivalent to steps S211 to S213. Read and write from and to the RAM at steps S205, S209, S210 and S214 are defined by assignment statements on the 78th and 79th lines of the list and "module RAM256C" shown in lines 82nd to 95th to be referred to on the 80th line.

Referring to the 19th to 27th lines of the list, step S206 is equivalent to the 22nd line of the list, step S207 is equivalent to the 23rd to 25th lines of the list, and step S208 is equivalent to the 20th and 21st lines of the list.

Referring to the 28th to 36th lines of the list, step S211 is equivalent to the 31st line of the list, step S212 is equivalent to the 32nd to 34th lines of the list, and step S213 is equivalent to the 29th and 30th lines of the list.

FIGS. 48 to 56 are circuit diagrams showing details of a structure of a bidirectional FILO generated on the basis of the contents of the HDL in Table 2.

Figure 48:
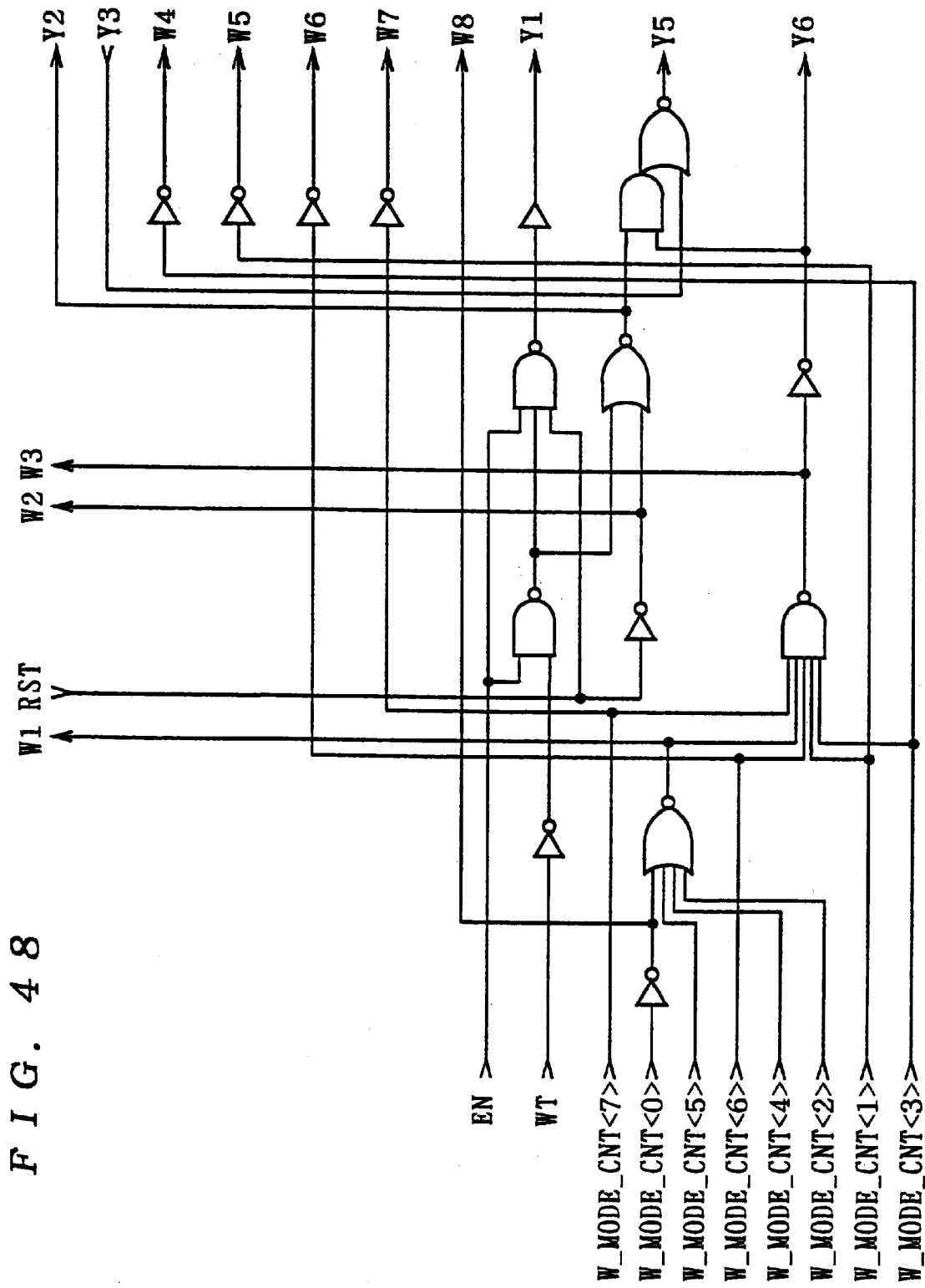
FIGS. 48 to 56 are circuit diagrams together showing details of a structure of the bidirectional FILO generated on the basis of the contents of a HDL in Tables 2.
Figure 49:
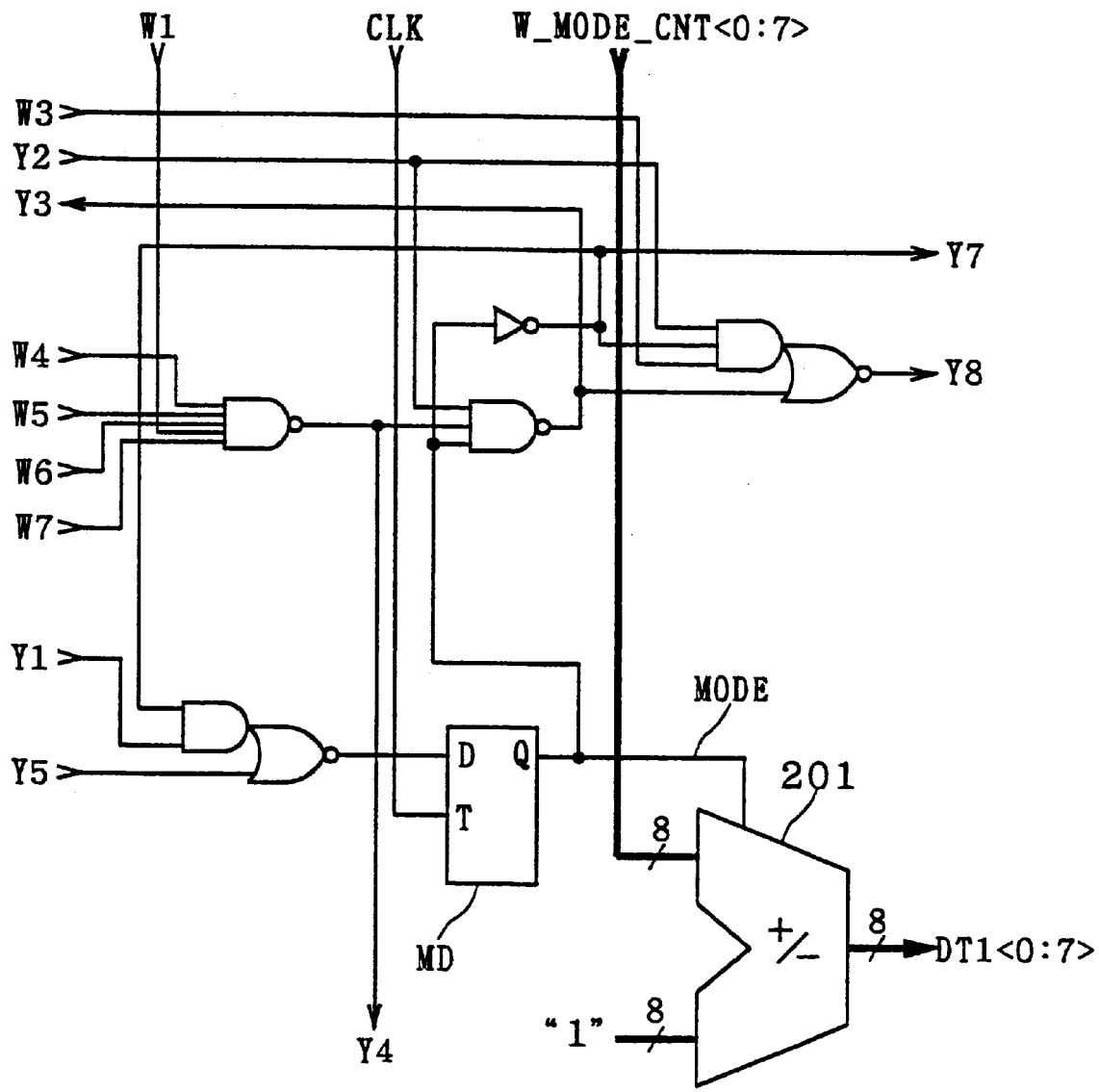

A circuit shown in FIG. 48 inputs an enable signal EN, a reset signal RST, a wait signal WT, an 8-bit mode control value W_MODE_CNT<0:7>, and a signal Y3 generated by a circuit shown in FIG. 49, and outputs signals Y1, Y2, Y5, Y6 and W1 to W8. The signal W2 has a value complementary to the reset signal RST, the signal W4 has a value complementary to W_MODE_CNT<3>, the signal W5 has a value complementary to W_MODE_CNT<1>, the signal W6 has a value complementary to W_MODE_CNT<6>, the signal W7 has a value complementary to W_MODE_CNT<7>, and the signal W8 has a value complementary to W_MODE_CNT<0>, the signal Y1 has "1" and "/RST+/WT (/ and + denote logical inversion and logical sum, respectively)" corresponding to the values "0" and "1" of the enable signal EN respectively, and the signal Y2 has "0" and "RST•/WT" (• denotes logical product) corresponding to the values "0" and "1" of the enable signal EN, respectively.

The circuit shown in FIG. 49 inputs the signals Y1, Y2, Y5, W3 to W7 generated by the circuit shown in FIG. 48, the 8-bit mode control value W_MODE_CNT<0:7> and the clock CLK, and outputs signals Y3, Y4, Y7 and Y8, 8-bit data DT1<0:7> and a mode signal MODE.

In FIG. 49, a D flip-flop MD outputs the mode signal MODE corresponding to the COUNT2 in FIG. 34. An adder-subtracter 201 is controlled to add 1 to or subtract 1 from the mode control value W_MODE_CNT depending on the mode signal MODE. The signal Y7 has a value complementary to the mode signal MODE.

Figure 50:
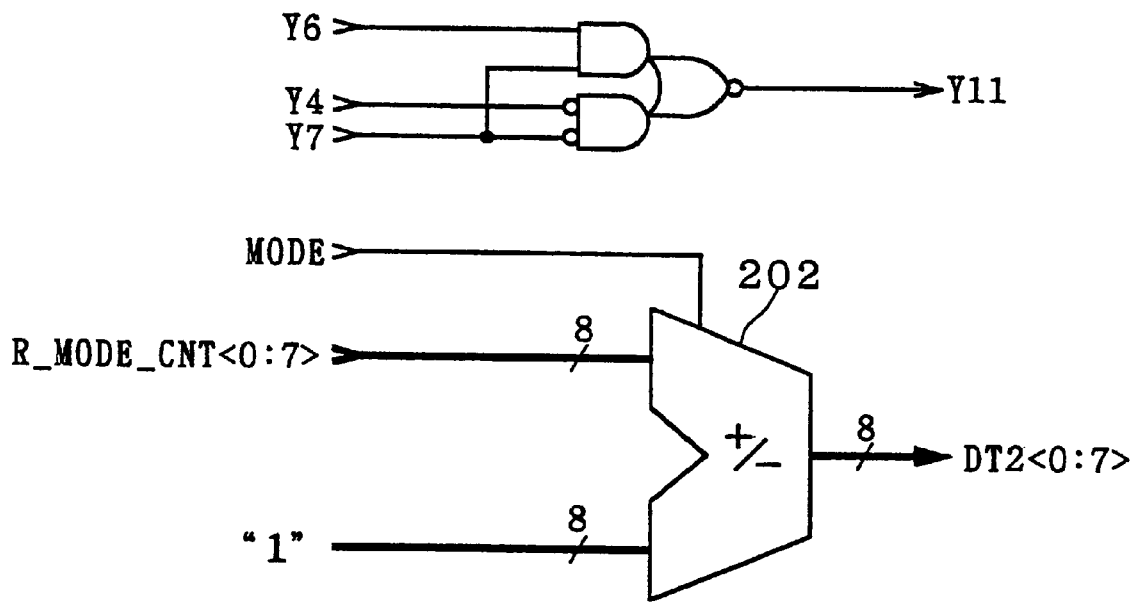

A circuit shown in FIG. 50 inputs the signal Y6 generated by the circuit shown in FIG. 48, the signals Y4 and Y7 and the mode signal MODE generated by the circuit shown in FIG. 49, and an 8-bit mode control value R_MODE_CNT<0:7>, and outputs a signal Y11 and 8-bit data DT2<0:7>. In FIG. 50, an adder-subtracter 202 is controlled to add 1 to or subtract 1 from the mode control value R_MODE_CNT depending on the mode signal MODE.

Figure 51:
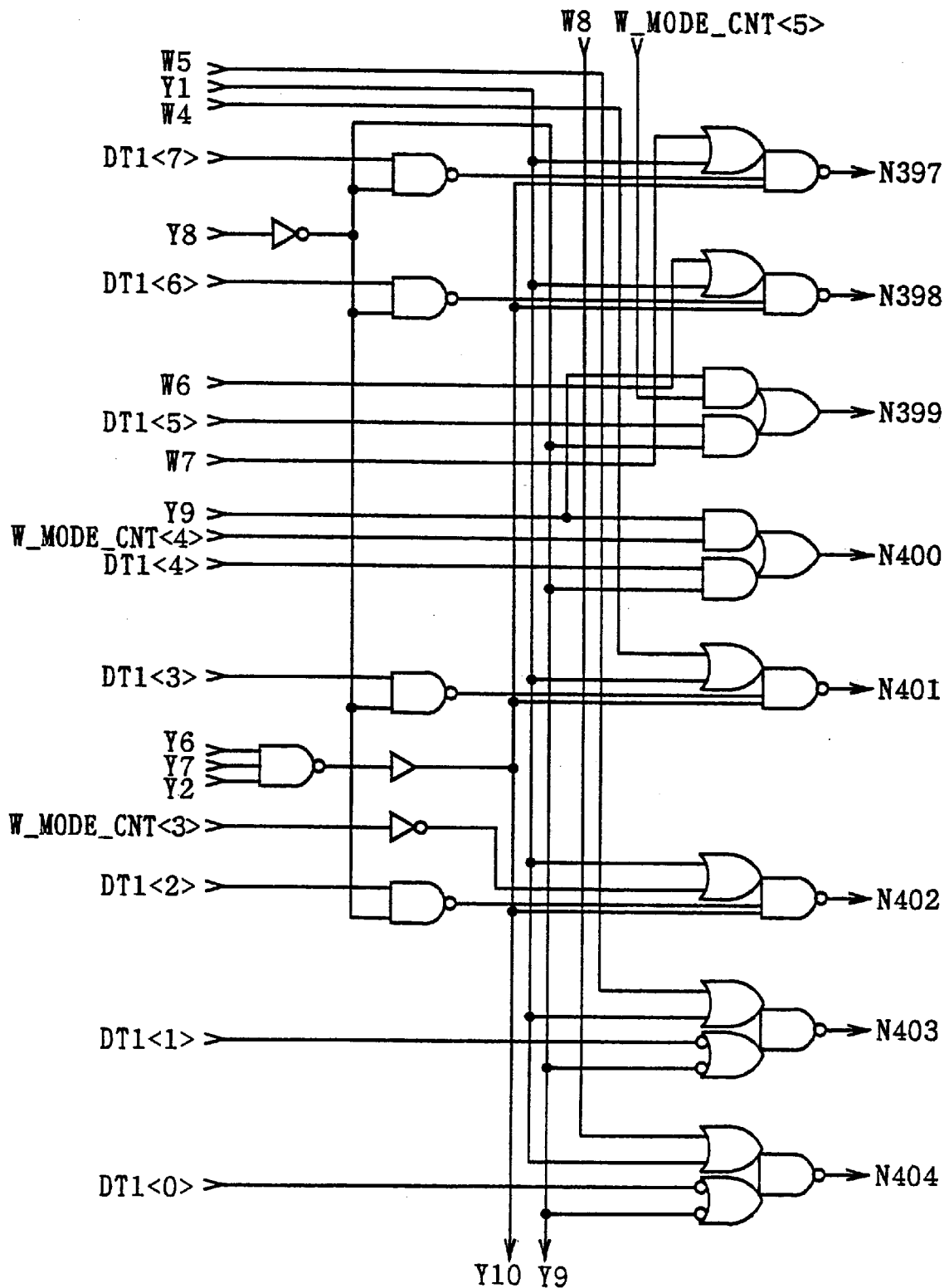
Figure 52:
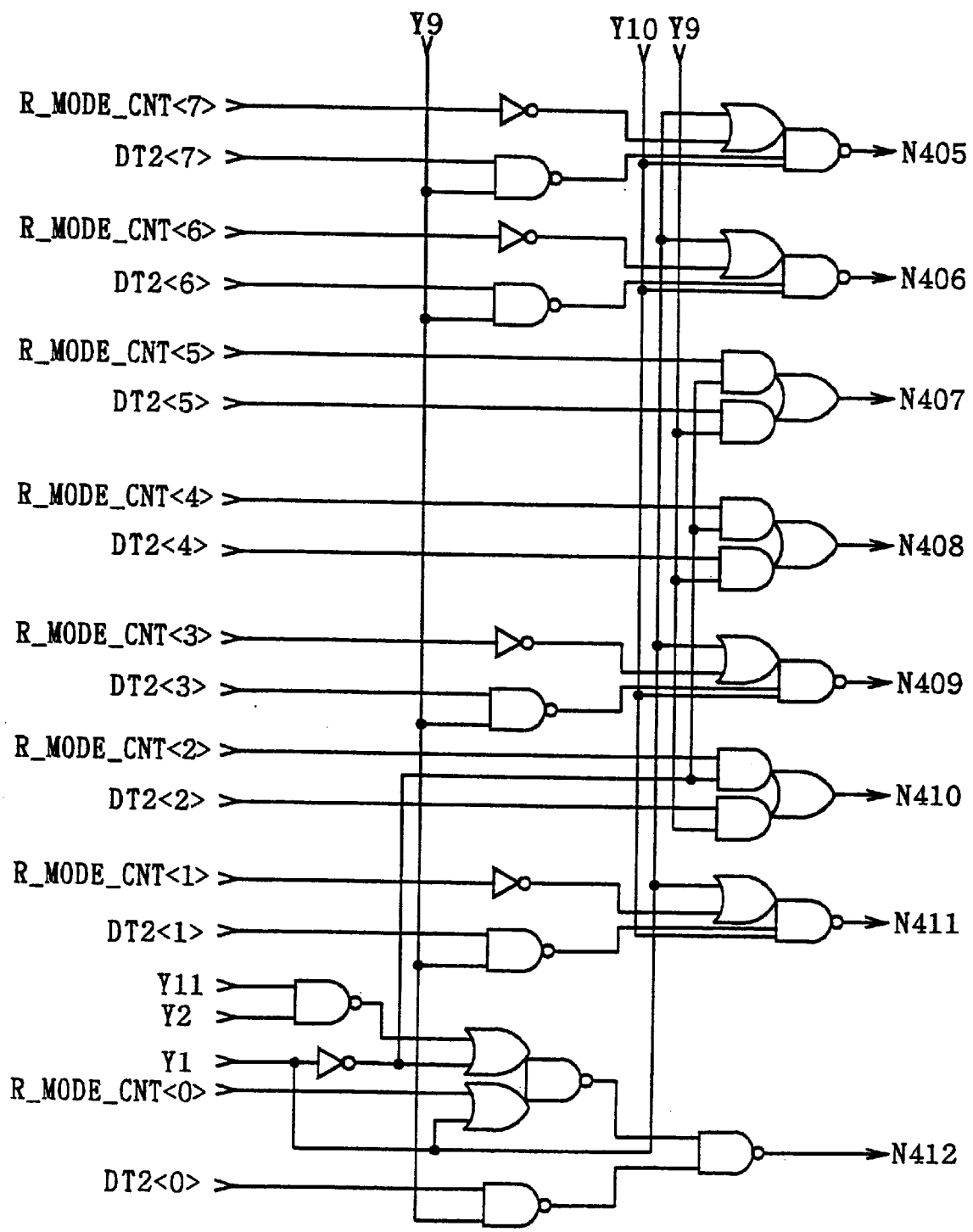

A circuit shown in FIG. 51 inputs the signals Y1, Y2, Y6 to Y9, and W4 to W8, a mode control value W_MODE_CNT<3:5> and the data DT1<0:7>, and outputs signals Y9, Y10 and N397 to N404. A circuit shown in FIG. 52 inputs the signals Y1, Y2, Y9 to Y11, the mode control value R_MODE_CNT<0:7> and data DT2<0:7>, and outputs signals N405 to N412.

Figure 53:
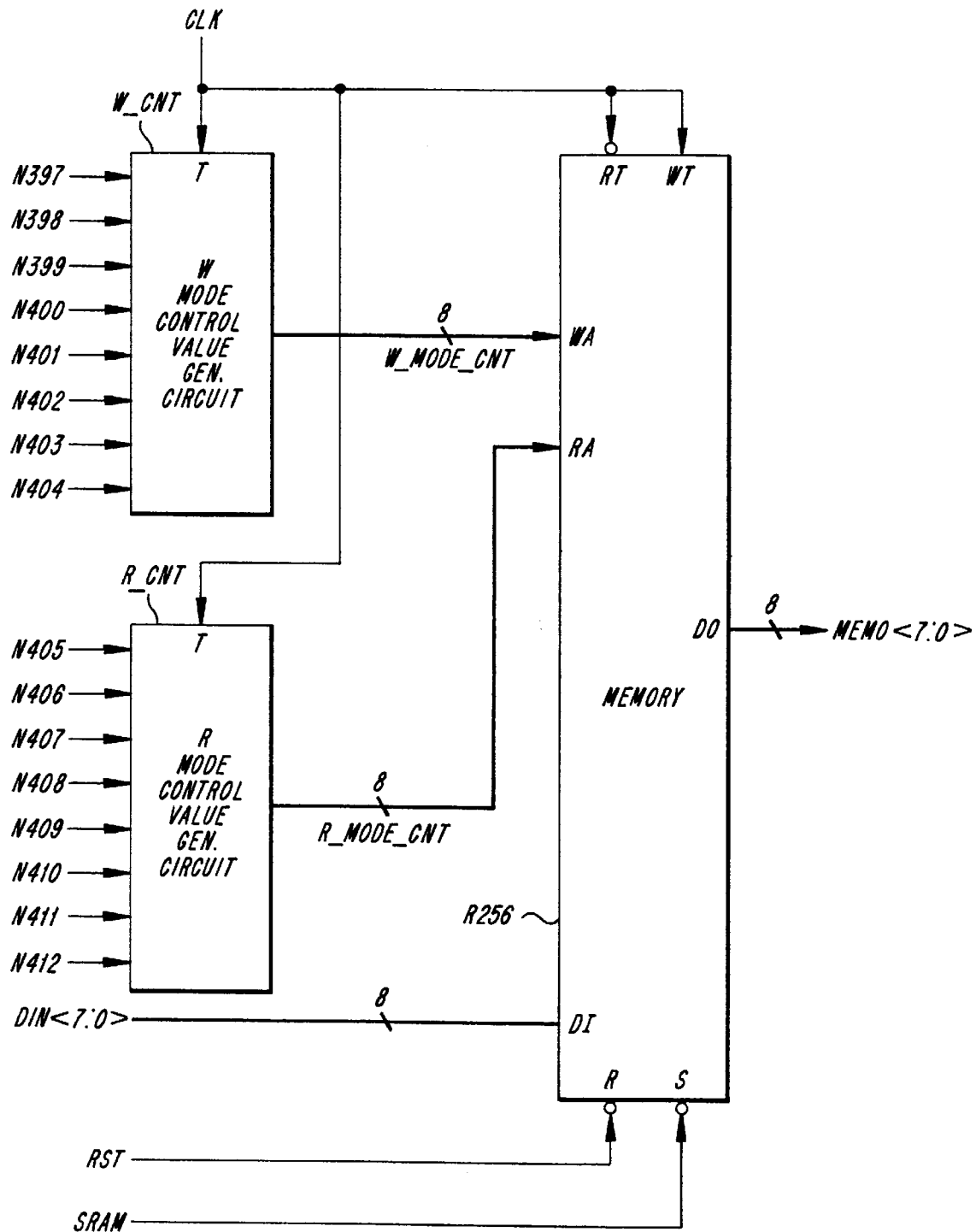

A circuit shown in FIG. 53 comprises a memory R256 acting as a RAM, a circuit W_CNT for generating a mode control value W_MODE_CNT from the signals N397 to N404, and a circuit R_CNT for generating a mode control value R_MODE_CNT from the signals N405 to N412. The mode control values W_MODE_CNT and R_MODE_CNT are given to a write address terminal WA and a read address terminal RA of the memory R256, respectively. The 8-bit input data DIN<7:0> is given to a write terminal DI and an 8-bit signal MEMO<7:0> is read from a read terminal DO. The clock CLK is sent to the circuits R_CNT and W_CNT, and write and read clock terminals WT and RT of the memory R256. The reset signal RST and the initializing signal SRAM are sent to a reset terminal R and an initializing terminal S of the R256, respectively.

Figure 54:
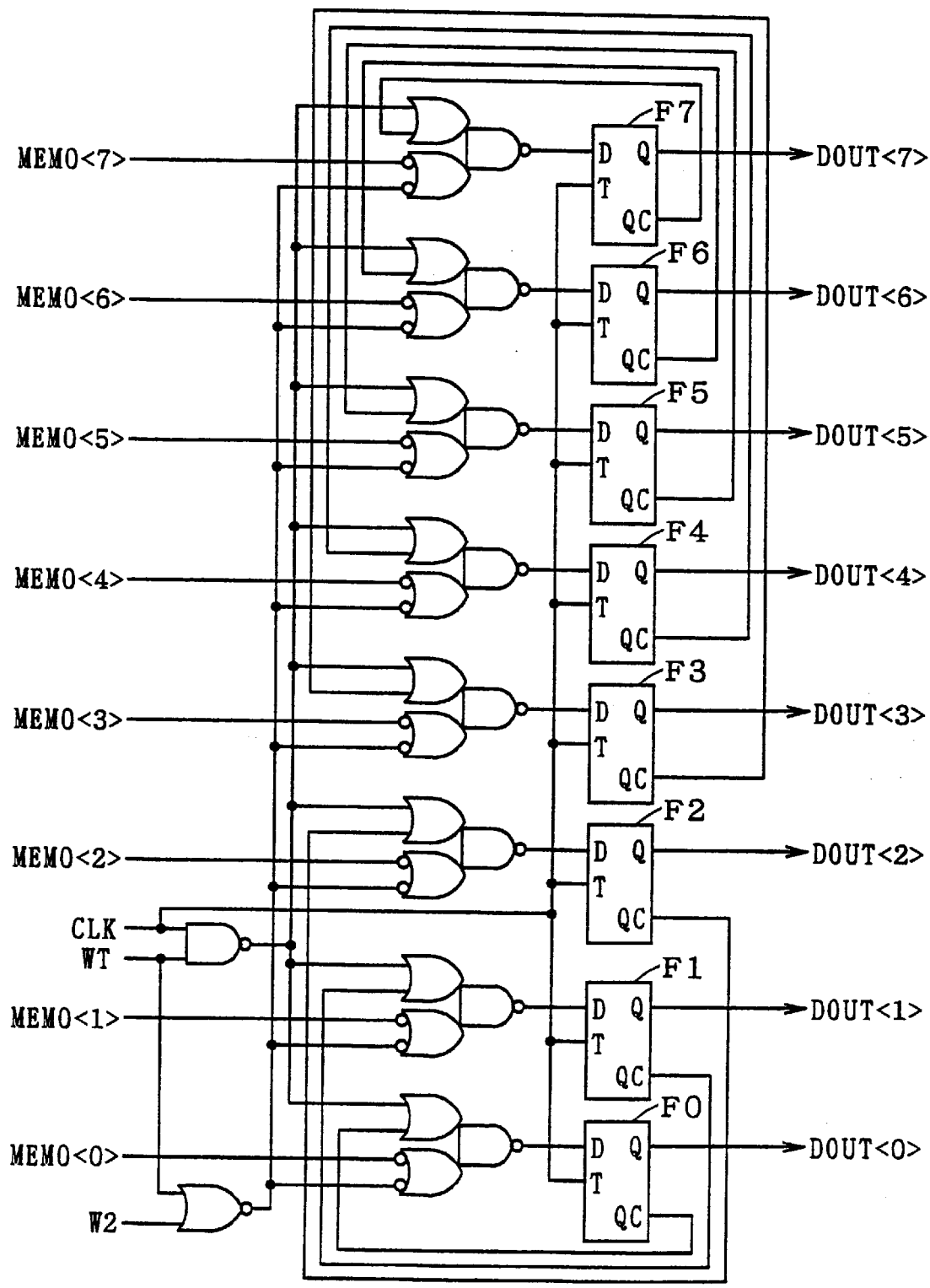

A circuit shown in FIG. 54 is equivalent to the multiplexer MUX3 shown in FIG. 34, and comprises D flip-flops F0 to F7 for sending output data DOUT<7:0>. The D flip-flops F0 to F7 are controlled by a signal MEMO<7:0> obtained from the memory R256, the clock CLK, the wait signal WT and the signal W2.

Figure 55:
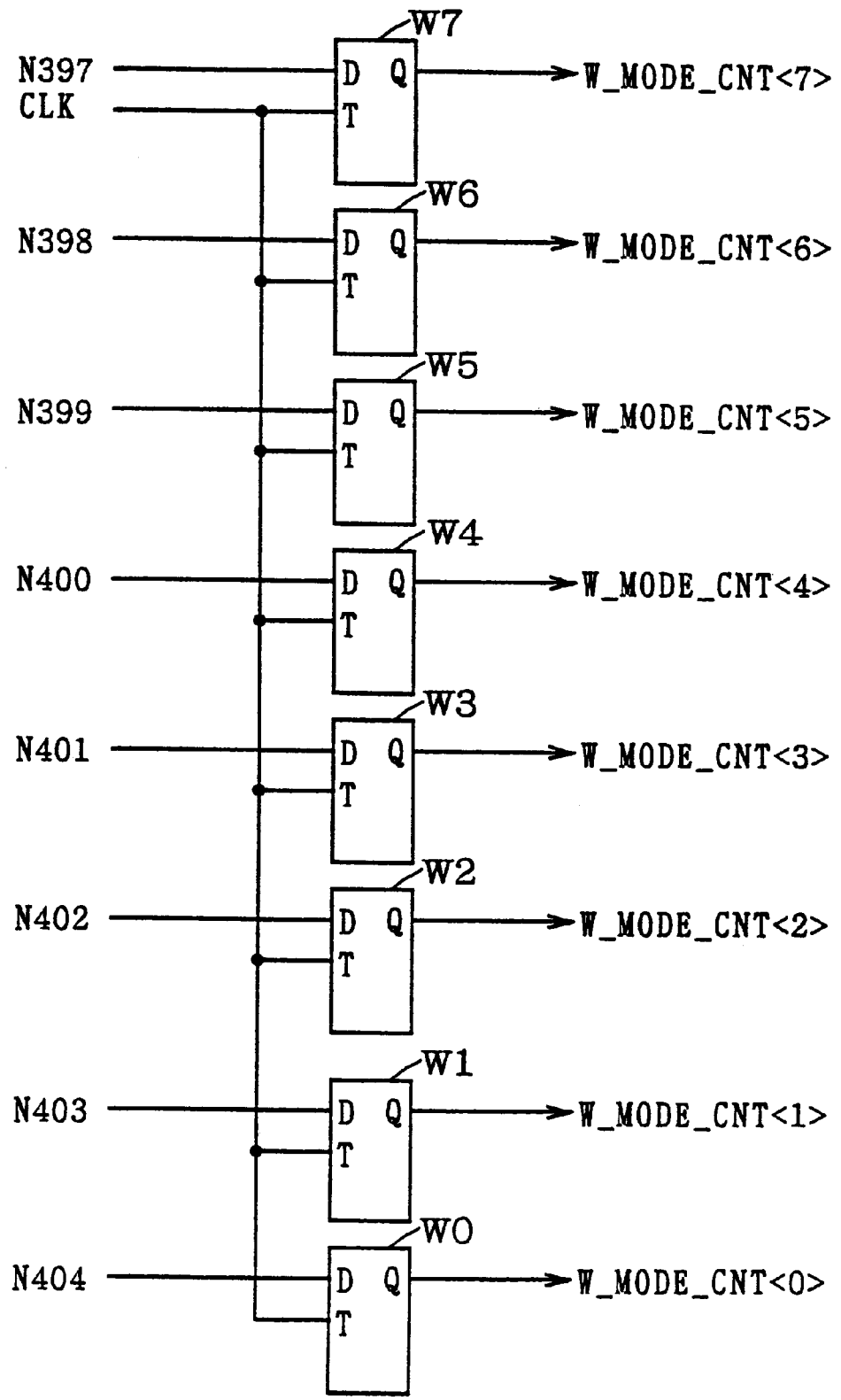

FIG. 55 shows a structure of a circuit W_CNT comprising D flip-flops W0 to W7. A D flip-flop Wp is controlled by the clock CLK, and outputs a mode control value W_MODE_CNT<p> (p=0 to 7) on receipt of a signal N (404−p).

Figure 56:
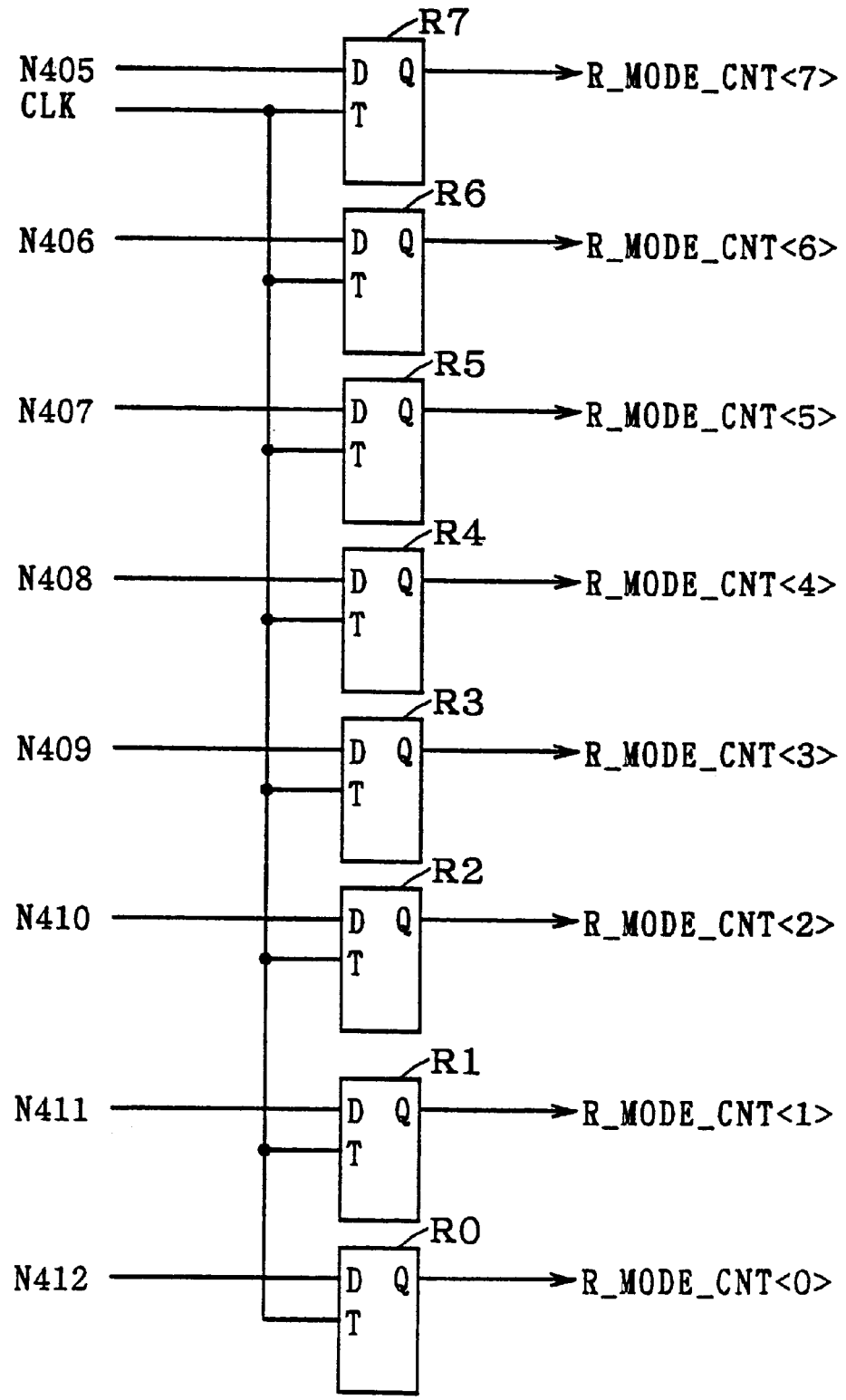
Figure 57:
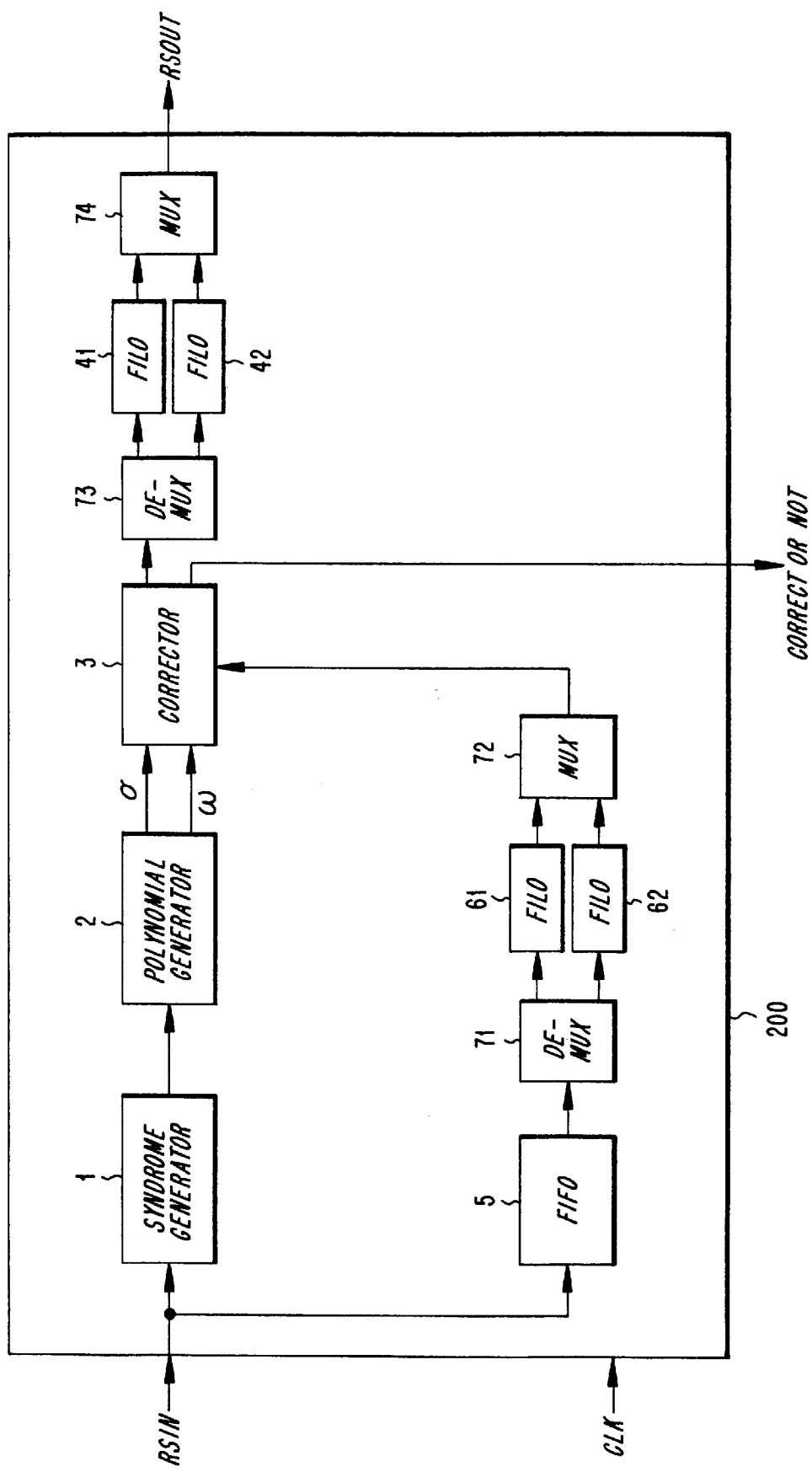
FIG. 57 is a block diagram showing a structure of a Reed-Solomon error correcting device 200 according to the prior art.

FIG. 56 shows a structure of a circuit R_CNT comprising D flip-flops R0 to R7. A D flip-flop Rq is controlled by the clock CLK, and outputs a mode control value R_MODE_CNT<q> (q=0 to 7) on receipt of a signal N (412−q).

While the invention has been described in detail, the foregoing description is in all aspects illustrative and not restrictive. It is understood that numerous other modifications and variations can be devised without departing from the scope of the invention.

We claim:

1. An error correcting device comprising:
   a polynomial generator for obtaining coefficients of an error-locator polynomial and an error-evaluator polynomial of an error correcting code in order from a final digit of said code to a first digit of said code;
   a first bidirectional transfer type memory for reversing a string of data forming said error correcting code;
   a corrector for correcting said error correcting code based on an output of said polynomial generator and an output of a reversing section; and
   a second bidirectional transfer type memory for reversing a string of data output from said corrector, wherein at least one of said first and second bidirectional transfer type memories has 0th to (N+K−1)th storage units (N≧2, K≧0) each for storing data having a predetermined length, input data form sets, each set having N input data, and are alternately input to said 0th and (N+K−1)th storage units, respective first data of two of said sets are opposed to each other through said K storage units, and shift transfer is sequentially performed (N+K−1) times for said data stored in said 0th to (N+K−1)th storage units, and directions of said shift transfer are alternately reversed so that said input data are switched back and output.

2. The error correcting device as defined in claim 1, wherein said error correcting code is a BCH code.

3. The error correcting device as defined in claim 2, wherein said error correcting code is a Reed-Solomon code.

4. The error correcting device as defined in claim 3, wherein said error-locator polynomial and said error-evaluator polynomial are obtained by using a Euclid method.

5. The error correcting device as defined in claim 1, wherein said first and second bidirectional transfer type memories stop said shift transfer by a wait instruction while holding stored contents of said storage unit.

6. The error correcting device as defined in claim 1, wherein said input data are stored in said 0th storage unit if a control signal has a first value, and are stored in said (N−1)th storage unit if said control signal has a second value, contents stored in said 0th to (N+K−2)th storage units are transferred to said 1st to (N+K−1)th storage units if said control signal has said first value, and contents stored in said 1st to (N+K−1)th storage units are transferred to said 0th to (N+K−2)th storage units if said control signal has said second value, said contents stored in said (N+K−1)th storage unit are employed as output data if said control signal has said first value, and said contents stored in said 0th storage unit are employed as the output data if said control signal has said second value, and said control signal is set to said second value corresponding to a first event that said input data are continuously written to said 0th storage unit N times, and is set to said first value corresponding to a second event that said input data are continuously written to said (N+K−1)th storage unit N times.

7. The error correcting device as defined in claim 6, wherein K is equal to 0.

8. The error correcting device as defined in claim 7, wherein either of said first and second bidirectional transfer type memories which has said 0th to (N−1)th storage units further includes:

an Ith control section (I=1 to N−1) for performing said data transfer in a direction specified by said control signal between said I and said (I−1)th storage units;

a demultiplexer for outputting said input data to either of said 0th and (N−1)th storage units on the basis of said control signal; and a multiplexer for outputting, as said output data, either of contents stored in said (N−1)th storage unit and contents stored in said 0th storage unit on the basis of said control signal.

9. The error correcting device as defined in claim 8, further comprising:

an N-nary counter for performing counting operation in response to a clock for controlling operation of said Ith control section; and a 1-bit binary counter for counting an output of said N-nary counter and outputting said control signal synchronized with said clock.

10. An error correcting device comprising:

a polynomial generator for obtaining coefficients of an error-locator polynomial and an error-evaluator polynomial of an error correcting code in order from a final digit of said code to a first digit of said code;

a first bidirectional transfer type memory for reversing a string of data forming said error correcting code;

a corrector for correcting said error correcting code based on an output of said polynomial generator and an output of a reversing section; and a second bidirectional transfer type memory for reversing a string of data output from said corrector, at least one of said first and second bidirectional transfer type memories including:

a memory, having 0th to (N+K−1)th storage units corresponding to 0th to (N+K−1)th addresses (N≧2, K≧0), and serving to operate in response to a clock; and an address generating section for generating read and write addresses of said memory, respectively, wherein each of said storage units stores data having a predetermined length, and input data form sets, each set having N input data, said input data are written following reading of contents stored in said storage units, and directions of movement of said read and write addresses are reversed corresponding to update of said sets.

11. The error correcting device as defined in claim 10, wherein said error correcting code is a BCH code.

12. The error correcting device as defined in claim 11, wherein said error correcting code is a Reed-Solomon code.

13. The error correcting device as defined in claim 12, wherein said error-locator polynomial and said error-evaluator polynomial are obtained by using a Euclid method.

14. The error correcting device as defined in claim 10, wherein said first and second bidirectional transfer type memories stop said shift transfer by a wait instruction while holding stored contents of said storage units.

15. The error correcting device as defined in claim 10, wherein said read address of said memory is set greater than said write address by said K and both said read address and said write address are increased by 1 in response to said clock if a control signal has a first value, said read address is set smaller than said write address by said K and both said read address and said write address are decreased by 1 in response to said clock if said control signal has a second value, said control signal is set to said second value corresponding to a first case where said write address specifies said (N−1)th storage unit, and is set to said first value corresponding to a second case where said write address specifies said Kth storage unit, said write address and said read address are set to said (N+K−1)th address and said (N−1)th address respectively after writing into said (N−1)th storage unit, and said write address and said read address are set to said 0th address and said Kth address respectively after said write is performed for said Kth storage unit.

16. The error correcting device as defined in claim 15, wherein either of said first and second bidirectional transfer type memories which has said 0th to (N+K−1)th storage units further includes:

a first comparator for detecting whether said write address specifies said Kth storage unit;

a second comparator for detecting whether said write address specifies said (N−1)th storage unit;

a write address setting section for set an initial value of said write address to said 0th and (N+K−1)th address on the basis of outputs of said first and second comparators, and for performing counting in response to said clock; and a read address setting section for set an initial value of said read address to said (N−1)th and Kth addresses on the basis of said outputs of said first and second comparators, and for performing counting in response to said clock.

17. The error correcting device as defined in claim 16, further comprising a 1-bit binary counter for counting said outputs of said first and second comparators, and outputting said control signal synchronized with said clock.

18. The error correcting device as defined in claim 15, wherein write and read of said memory are performed in response to rise and fall of said clock respectively, and said write and read addresses are successively updated after said write of said memory.

\* \* \* \* \*